(12) United States Patent
Tanaka

(10) Patent No.: US 7,829,431 B2
(45) Date of Patent: Nov. 9, 2010

(54) METHOD FOR MANUFACTURING A SOI WITH PLURALITY OF SINGLE CRYSTAL SUBSTRATES

(75) Inventor: Koichiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 80 days.

(21) Appl. No.: 12/216,553

(22) Filed: Jul. 8, 2008

(65) Prior Publication Data

US 2009/0017581 A1      Jan. 15, 2009

(30) Foreign Application Priority Data

Jul. 13, 2007     (JP)     ............... 2007-183906

(51) Int. Cl.
*H01L 21/00* (2006.01)
*H01L 21/301* (2006.01)

(52) U.S. Cl. ............... 438/455; 438/458; 257/E21.704; 257/E21.001

(58) Field of Classification Search ................. 438/113, 438/455, 458; 257/E21.001, E21.04, E21.7, 257/E21.701, E21.704
See application file for complete search history.

(56) References Cited

U.S. PATENT DOCUMENTS

| | | | |
|---|---|---|---|
| 5,132,820 A | 7/1992 | Someya et al. | |
| 5,374,564 A | 12/1994 | Bruel | |
| 5,532,850 A | 7/1996 | Someya et al. | |
| 5,852,488 A | 12/1998 | Takemura | |
| 6,066,860 A | 5/2000 | Katayama et al. | |
| 6,140,210 A | 10/2000 | Aga et al. | |
| 6,146,979 A | 11/2000 | Henley et al. | |
| 6,159,824 A | 12/2000 | Henley et al. | |
| 6,287,941 B1 | 9/2001 | Kang et al. | |

(Continued)

FOREIGN PATENT DOCUMENTS

JP          01-076034          3/1989

(Continued)

OTHER PUBLICATIONS

International Search Report (Application No. PCT/JP2008/059602) dated Aug. 19, 2008.

(Continued)

*Primary Examiner*—Julio J Maldonado
*Assistant Examiner*—Michele Fan
(74) *Attorney, Agent, or Firm*—Eric J. Robinson; Robinson Intellectual Property Law Office, P.C.

(57) ABSTRACT

A single-crystal semiconductor layer is provided in a large area over a large-sized glass substrate, whereby a large-scale SOI substrate is obtained. A single-crystal semiconductor substrate provided with an embrittlement layer and a dummy substrate are bonded to each other, and the single-crystal semiconductor substrate is separated at the embrittlement layer as a boundary by heat treatment to form a piece of single-crystal semiconductor over the dummy substrate. The dummy substrate is divided to form a piece of single-crystal semiconductor. The piece of single-crystal semiconductor is bonded to a supporting substrate, and the piece of single-crystal semiconductor is separated from the dummy substrate. Then, a plurality of pieces of single-crystal semiconductor are arranged and transferred to the large-sized glass substrate.

8 Claims, 16 Drawing Sheets

U.S. PATENT DOCUMENTS

| | | |
|---|---|---|
| 6,310,372 B1 | 10/2001 | Katayama et al. |
| 6,320,204 B1 | 11/2001 | Hirabayashi et al. |
| 6,372,609 B1 | 4/2002 | Aga et al. |
| 6,380,046 B1 | 4/2002 | Yamazaki |
| 6,403,395 B2 | 6/2002 | Hirabayashi et al. |
| 6,593,626 B2 | 7/2003 | Hirabayashi et al. |
| 6,653,209 B1 | 11/2003 | Yamagata |
| 6,759,277 B1 | 7/2004 | Flores et al. |
| 6,818,529 B2 | 11/2004 | Bachrach et al. |
| 6,884,694 B2 | 4/2005 | Park et al. |
| 7,038,277 B2 | 5/2006 | Chu et al. |
| 7,052,974 B2 | 5/2006 | Mitani et al. |
| 7,119,365 B2 | 10/2006 | Takafuji et al. |
| RE39,484 E | 2/2007 | Bruel |
| 7,199,024 B2 | 4/2007 | Yamazaki |
| 7,199,397 B2 | 4/2007 | Huang et al. |
| 7,253,040 B2 | 8/2007 | Itoga et al. |
| 7,298,009 B2 | 11/2007 | Yan et al. |
| 7,312,487 B2 | 12/2007 | Alam et al. |
| 7,332,384 B2 | 2/2008 | Buchholtz et al. |
| 7,354,844 B2 | 4/2008 | Endo et al. |
| 7,619,250 B2 | 11/2009 | Takafuji et al. |
| 2002/0109144 A1 | 8/2002 | Yamazaki |
| 2002/0180902 A1 | 12/2002 | Izumi et al. |
| 2003/0203547 A1* | 10/2003 | Sakaguchi et al. .......... 438/151 |
| 2004/0061176 A1 | 4/2004 | Takafuji et al. |
| 2004/0238851 A1 | 12/2004 | Flores et al. |
| 2005/0202595 A1* | 9/2005 | Yonehara et al. ............ 438/110 |
| 2007/0026580 A1 | 2/2007 | Fujii |
| 2007/0026638 A1 | 2/2007 | Henley |
| 2007/0034157 A1 | 2/2007 | Nakata et al. |
| 2007/0173000 A1 | 7/2007 | Yamazaki |
| 2008/0061301 A1 | 3/2008 | Yamazaki |
| 2008/0063840 A1 | 3/2008 | Morita et al. |
| 2008/0067529 A1 | 3/2008 | Yamazaki |
| 2008/0067597 A1 | 3/2008 | Yamazaki |
| 2008/0083953 A1 | 4/2008 | Yamazaki |
| 2008/0213953 A1 | 9/2008 | Yamazaki |
| 2008/0254560 A1 | 10/2008 | Yamazaki |
| 2008/0283848 A1 | 11/2008 | Yamazaki |
| 2008/0286941 A1 | 11/2008 | Yamazaki |
| 2008/0286942 A1 | 11/2008 | Yamazaki |
| 2008/0286956 A1 | 11/2008 | Yamazaki |
| 2008/0299744 A1 | 12/2008 | Yamazaki et al. |
| 2008/0315350 A1 | 12/2008 | Tanaka |
| 2009/0047771 A1 | 2/2009 | Yamazaki et al. |
| 2009/0079024 A1 | 3/2009 | Yamazaki |
| 2009/0079025 A1 | 3/2009 | Yamazaki |
| 2009/0081844 A1 | 3/2009 | Yamazaki |
| 2009/0081845 A1 | 3/2009 | Yamazaki et al. |
| 2009/0140253 A1 | 6/2009 | Kasahara |

FOREIGN PATENT DOCUMENTS

| | | |
|---|---|---|
| JP | 64-061943 | 3/1989 |
| JP | 01-184927 | 7/1989 |
| JP | 02-033031 | 3/1990 |
| JP | 02-234124 | 9/1990 |
| JP | 05-090117 | 4/1993 |
| JP | 05-211128 | 8/1993 |
| JP | 06-018926 | 1/1994 |
| JP | 07-297377 | 11/1995 |
| JP | 11-163363 | 6/1999 |
| JP | 2000-012864 | 1/2000 |
| JP | 2000-241829 | 9/2000 |
| JP | 2003-058080 | 2/2003 |
| JP | 2003068592 A * | 3/2003 |
| JP | 2003-257804 | 9/2003 |
| JP | 2003-324188 | 11/2003 |
| JP | 2004-134675 | 4/2004 |
| JP | 2005-039171 | 2/2005 |
| WO | 2004/025360 | 3/2004 |

OTHER PUBLICATIONS

Written Opinion (Application No. PCT/JP2008/059602) Dated Aug. 19, 2008.

Sullivan. J et al., "P-220L: Late-News Poster: Layer-Transfer of Silicon Single-Crystal Films On Large-Area Glass Substrates for Mobile Display Applications", SID Digest '06: SID International Symposium Digest of Technical Papers, pp. 280-282.

* cited by examiner

METHOD FOR MANUFACTURING A SOI WITH PLURALITY OF SINGLE CRYSTAL SUBSTRATES

BACKGROUND OF THE INVENTION

1. Field of the Invention

The present invention relates to a method for manufacturing a semiconductor substrate. In particular, the present invention relates to a method for manufacturing a semiconductor substrate in which a single-crystal semiconductor layer is bonded to a substrate having an insulating surface such as glass or the like. Further, the present invention relates to semiconductor devices which have circuits including thin film transistors (hereinafter, referred to as TFTs) that use the semiconductor substrate. For example, the present invention relates to electro-optical devices typified by liquid crystal display panels, or electronic devices which have light-emitting display devices including an organic light-emitting element as a component.

Note that a semiconductor device refers to any device which can function by utilizing semiconductor characteristics in this specification. Electro-optical devices, semiconductor circuits, and electronic devices are all semiconductor devices.

2. Description of the Related Art

In recent years, attention has focused on a technique for making a thin film transistor (TFT) by using a semiconductor thin film (having a thickness of about several to about several hundreds of nanometers) formed over a substrate having an insulating surface. The thin film transistors are widely applied to electronic devices such as ICs and electro-optical devices, and their rapid development as switching elements for image display devices is particularly desired.

A semiconductor substrate called a silicon-on-insulator (SOI substrate) that has a thin single-crystal semiconductor layer on an insulating layer has been developed instead of a silicon wafer that is manufactured by thinly slicing an ingot of a single-crystal semiconductor. The SOI substrates are spreading as substrates in manufacturing microprocessors or the like. This is because an integrated circuit using an SOI substrate attracts attention as an integrated circuit in which parasitic capacitance between a drain of a transistor and a substrate can be reduced, performance of the semiconductor integrated circuit can be improved, and low power consumption is achieved.

As a method for manufacturing SOI substrates, a hydrogen ion implantation separation method is known (e.g., see Patent Document 1: U.S. Pat. No. 6,372,609). The hydrogen ion implantation separation method is a method by which hydrogen ions are implanted into a first silicon wafer whose surface is thermally oxidized to form a microbubble layer at a predetermined depth from the surface, and then, the surface is located in close contact with a second silicon wafer with the thermal oxidized film interposed therebetween, and a thin silicon layer (SOI layer) is bonded to the second silicon wafer using the microbubble layer as a cleavage plane. In addition to heat treatment for separating an SOI layer, it is necessary to perform heat treatment in an oxidizing atmosphere to form an oxide film on the SOI layer, remove the oxide film, and perform heat treatment at 1000° C. to 1300° C. in a reducing atmosphere to increase bonding strength.

On the other hand, attempts have been made to form an SOI layer on an insulating substrate such as glass or the like. As an example of SOI substrates in which SOI layers are formed on glass substrates, an SOI substrate in which a thin single-crystal silicon layer is formed on a glass substrate having a coating film by a hydrogen ion implantation separation method is known (see Patent Document 2: U.S. Pat. No. 7,119,365). In this case also, a thin single-crystal silicon layer (SOI layer) is formed on the glass substrate in such a way that a microbubble layer is formed at a predetermined depth from the surface by implantation of hydrogen ions to a piece of single-crystal silicon, the glass substrate and the piece of single-crystal silicon are bonded to each other, and the piece of single-crystal silicon is separated using the microbubble layer as a cleavage plane.

A glass substrate is rectangular in shape and had a size of 300 mm×400 mm for the first generation in the beginning of 1990, which has grown to 680 mm×880 mm or 730 mm×920 mm for the fourth generation in 2000.

In contrast, size of semiconductor substrates is not so varied because semiconductor substrates are manufactured by forming an ingot of 20 cm to 30 cm in diameter by a Czochralski method (a CZ method), and slicing the ingot with a diamond blade or the like so that the slice has a thickness of about 0.5 mm to about 1.5 mm to make a circle wafer.

Accordingly, in the case of manufacturing an active matrix display device using a glass substrate which is larger than a semiconductor substrate, a plurality of semiconductor substrates is used for a single glass substrate. At that time, there has been a problem in that it is difficult to form a plurality of single-crystal semiconductor layers over the single glass substrate without a space by a hydrogen ion implantation separation method. There is a chamfer portion so as to prevent chipping or cracking at an end face of a semiconductor substrate, and the semiconductor substrate is not located in close contact with the glass substrate at the chamfer portion; therefore, a single-crystal semiconductor layer is not formed over the glass substrate. In addition, there is a portion where ion doping is incapable of being performed or a thin film is incapable of being formed in the end portion of the surface of the semiconductor substrate because the end portion of the semiconductor substrate is held by a jig at the time of ion doping or of film formation. Therefore, the portion is incapable of being separated from the single-crystal semiconductor layer, and the single-crystal semiconductor layer is incapable of being formed over the glass substrate.

Since the chamfer portion or the portion to be held by a jig generally has about several millimeters, there is at least a space of several millimeters between a plurality of single-crystal semiconductor layers. In general, in the case where a 40-inch high-definition television is used, it is necessary to narrow a space to about 200 μm to about 300 μm.

SUMMARY OF THE INVENTION

In view of the foregoing problems, an object of the present invention is to provide a uniform single-crystal semiconductor layer in a large area over a large-sized glass substrate, a single-crystal semiconductor layer is formed over a dummy substrate provided with a separation layer, and then a piece of single-crystal semiconductor is separated from the dummy substrate, and the piece of single-crystal semiconductor is transferred to the large-sized glass substrate.

Note that a large-sized glass substrate in this specification refers to a glass substrate larger than a semiconductor substrate.

By the present invention, a plurality of single-crystal semiconductor layers is transferred to a large-sized glass substrate; therefore, the plurality of single-crystal semiconductor layers is substantially in contact with each other and a uniform single-crystal semiconductor layer can be formed in a large area. Here, the phrase "to be substantially in contact with each other" refers to a state in which the plurality of single-crystal semiconductor layers is arranged in contact with each other or having several hundreds of micrometers or less (preferably, 300 μm or less).

DETAILED DESCRIPTION OF THE INVENTION

Hereinafter, embodiment modes of the present invention will be described using the accompanying drawings. However, the present invention can be implemented in various modes. As can be easily understood by those skilled in the art, the modes and details of the present invention can be changed in various ways without departing from the spirit and scope of the present invention. Thus, the present invention should not be taken as being limited to the following description of the embodiment modes.

Embodiment Mode 1

Figure 1A:
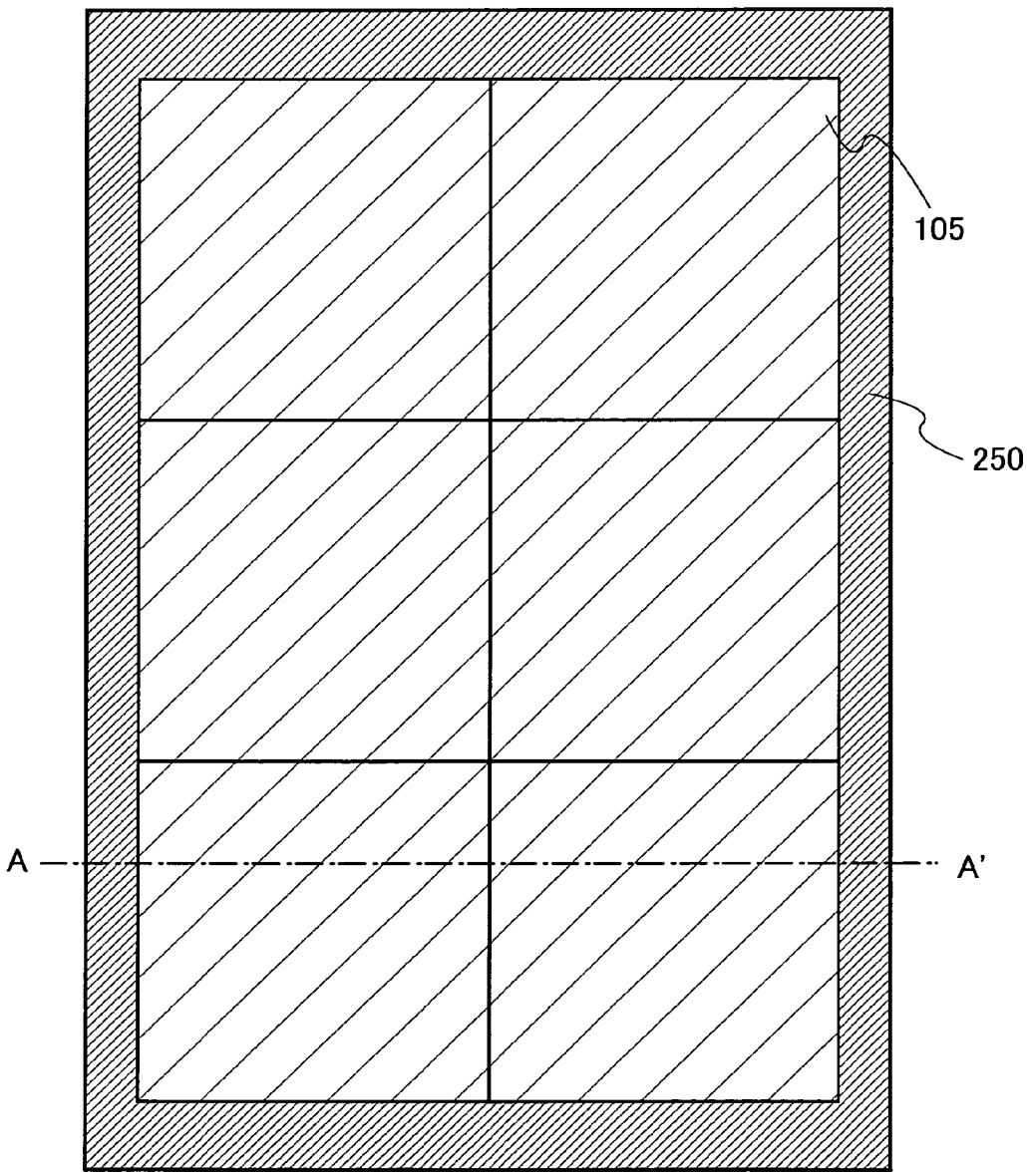
FIGS. 1A and 1B are diagrams showing a semiconductor substrate in Embodiment Mode 1 of the present invention.
Figure 1B:
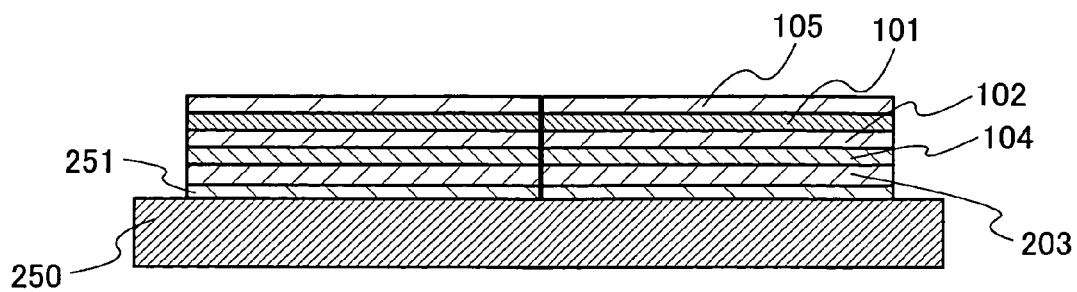

FIGS. 1A and 1B are diagrams showing a semiconductor substrate in this embodiment mode. FIG. 1A is a plan view, and FIG. 1B is a cross-sectional view taken along line A-A' in FIG. 1A. A semiconductor substrate in this embodiment mode is formed in such a way that a plurality of single-crystal semiconductor layers 105 having a rectangular shape is arranged over a large-sized glass substrate 250 in a state that the plurality of single-crystal semiconductor layers 105 having a rectangular shape is substantially in contact with each other (even if there is a space, the space is several hundreds of micrometers, preferably, 300 μm or less), as shown in FIGS. 1A and 1B.

In accordance with necessity, a film which is used to prevent diffusion of impurities from glass or a film which is used to secure adhesion may be formed between the large-sized glass substrate 250 and the single-crystal semiconductor layer 105. In FIGS. 1A and 1B, an example is shown in which a silicon oxynitride film 101, a silicon nitride oxide film 102, a bonding layer 104, and a silicon oxide film 203 are formed below the single-crystal semiconductor layer 105, and the silicon oxide film 203 and the large-sized glass substrate 250 are bonded together using an adhesive 251.

Note that, in FIGS. 1A and 1B, six pieces of single-crystal semiconductor layers 105 are formed over one piece of the large-sized glass substrate 250; however, the present invention is not limited thereto. In addition, the shape of the single-crystal semiconductor layers 105 is not limited to a rectangular shape, and other shapes may be used as well.

Since a plurality of single-crystal semiconductor layers is arranged over the large-sized glass substrate in this manner in a state that the plurality of single-crystal semiconductor layers is arranged to be substantially in contact with each other, a uniform single-crystal semiconductor layer can be obtained in a large area. For example, the present invention is applicable to a liquid crystal display having a large area and to an organic EL display having a large area.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Next, a method for manufacturing a semiconductor substrate in this embodiment mode will be described. FIGS. 2A to 2C, FIGS. 3A to 3D, FIGS. 4A to 4D, and FIGS. 5A to 5D are cross-sectional views showing a manufacturing process of a semiconductor device in this embodiment mode.

Figure 2A:
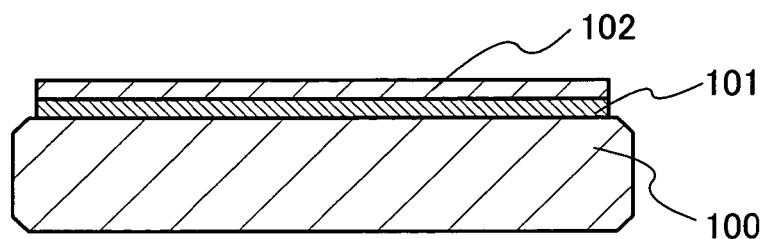
FIGS. 2A to 2C are cross-sectional views showing a manufacturing process of a semiconductor device in Embodiment Mode 1 of the present invention.

First, the silicon oxynitride film 101 is formed over a silicon wafer 100, as shown in FIG. 2A. Although the thickness of the silicon oxynitride film 101 may be determined as appropriate by a practitioner, the silicon oxynitride film 101 may have a thickness of 10 nm to 500 nm (preferably, 10 nm to 150 nm). The silicon oxynitride film 101 functions as part of an insulating layer in an SOI substrate later. Note that the silicon oxynitride film 101 can be formed by a CVD (chemical vapor deposition) method such as a plasma CVD method, a low pressure CVD method, or the like; a sputtering method; or the like. Note that treatment is performed on the surface of the silicon wafer 100 with oxygen radicals (which may include OH radicals) which are generated by plasma discharge in an oxygen-containing atmosphere and treatment is performed on the surface of the silicon wafer 100 with nitrogen radicals (which may include NH radicals) which are generated by plasma discharge in a nitrogen-containing atmosphere, whereby the silicon oxynitride film 101 can be formed over the silicon wafer 100. The silicon oxynitride film 101 is formed so that bonding strength when the silicon oxynitride film 101 is bonded to a glass substrate later can be strengthened. Note that, in the case where there is no problem in bonding strength, the silicon oxynitride film 101 is not necessarily provided.

Next, the silicon nitride oxide film 102 is formed over the silicon oxynitride film 101, which can prevent mixing of impurities such as sodium or the like from the glass substrate. Although the thickness of the silicon nitride oxide film 102 may be set as appropriate by a practitioner, the silicon nitride oxide film 102 may have a thickness of 10 nm to 500 nm (preferably, 10 nm to 200 nm). The silicon nitride oxide film 102 also serves as part of the insulating layer in the SOI substrate later. Note that the silicon nitride oxide film 102 can be formed by a CVD method such as a plasma CVD method, a low pressure CVD method, or the like; a sputtering method; or the like. The silicon oxynitride film 101 and the silicon nitride oxide film 102 are preferably formed successively without being exposed to the atmosphere in order to prevent mixing of impurities. The silicon nitride oxide film 102 may be provided as appropriate, if necessary, and the silicon nitride oxide film 102 is not necessarily formed. In addition, an example is shown in which the silicon nitride oxide film 102 is formed over the silicon oxynitride film 101; however, the reverse order may be used. Furthermore, a silicon nitride film may be provided between the silicon oxynitride film 101 and the silicon nitride oxide film 102.

As described above, when the silicon oxynitride film 101 and the silicon nitride oxide film 102 are formed over the silicon wafer 100, there is a chamfer portion at the end of the silicon wafer 100, and besides, there is a portion where a film cannot be formed at the end of the surface of the silicon wafer 100 because the surface of the silicon wafer 100 is held by a jig.

Figure 2B:
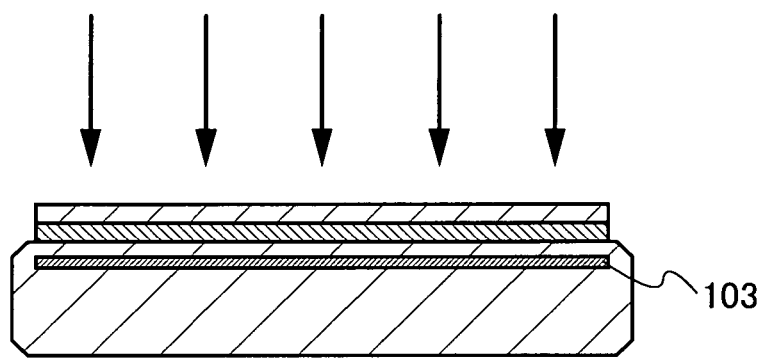

Next, as shown in FIG. 2B, the silicon wafer 100 is doped with hydrogen at a dose of about $1.0 \times 10^{16}$ ions/cm$^2$ to about $3.0 \times 10^{16}$ ions/cm$^2$ by using an ion doping apparatus, whereby an embrittlement layer 103 is formed. Not an ion implanter but an ion doping apparatus is used, so that a substrate can be subjected to planar doping of hydrogen at one time without being scanned, and cycle time can be decreased. Note that there is a chamfer portion at the end of the silicon wafer 100, and besides, there is a portion where ion doping cannot be performed at the end of the surface of the silicon wafer 100 because the silicon wafer 100 is held by a jig.

Figure 2C:
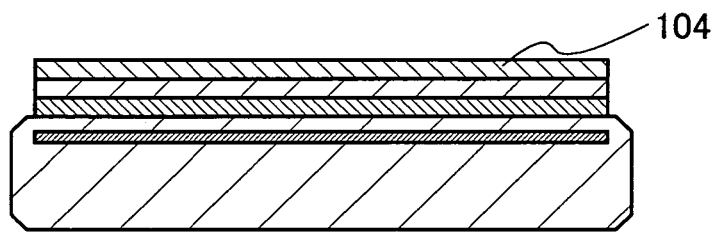

Then, the bonding layer 104 is formed as shown in FIG. 2C. A silicon oxide film is suitable for the bonding layer 104. In particular, a silicon oxide film which is formed by a chemical vapor deposition method using an organic silane gas is preferable. Examples of an organic silane gas that can be used include silicon-containing compounds such as tetraethoxysilane, tetramethylsilane, tetramethylcyclotetrasiloxane, octamethylcyclotetrasiloxane, hexamethyldisilazane, triethoxysilane, trisdimethylaminosilane, or the like. Alternatively, a thermal oxide layer formed through heat treatment at high temperature on the silicon wafer 100 or chemical oxide can be used for the bonding layer 104. For example, chemical oxide can be formed by treating the surface of the silicon wafer 100 with ozone-containing water. Chemical oxide is formed reflecting the planarity of the surface of the silicon wafer 100, which is preferable. Note that there is a chamfer portion at the end of the silicon wafer 100, and besides, there is a portion where a film cannot be formed at the end of the silicon wafer 100 surface because the silicon wafer 100 is held by a jig.

Figure 3A:
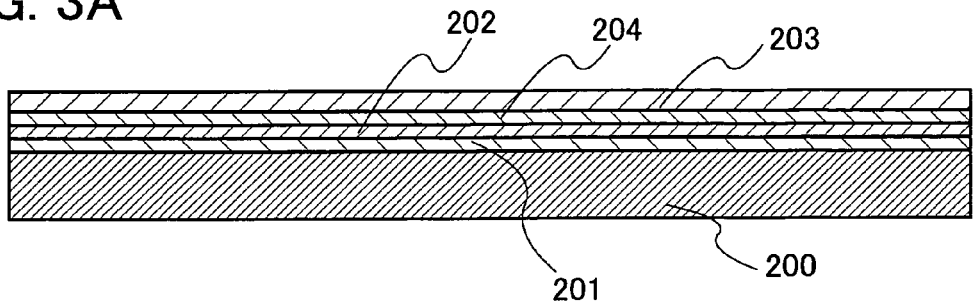
FIGS. 3A to 3D are cross-sectional views showing a manufacturing process of a semiconductor device in Embodiment Mode 1 of the present invention.

Next, as shown in FIG. 3A, a silicon oxynitride film 201 is formed at a thickness of 50 nm to 100 nm over a glass substrate 200 which is to serve as a dummy substrate by using a plasma CVD apparatus. A tungsten film 202 is formed thereover at a thickness of 20 nm to 50 nm by using a sputtering apparatus. Further, the silicon oxide film 203 is formed thereover by using a sputtering apparatus. At this time, a tungsten oxide film 204 is formed between the tungsten film 202 and the silicon oxide film 203.

Figure 3B:
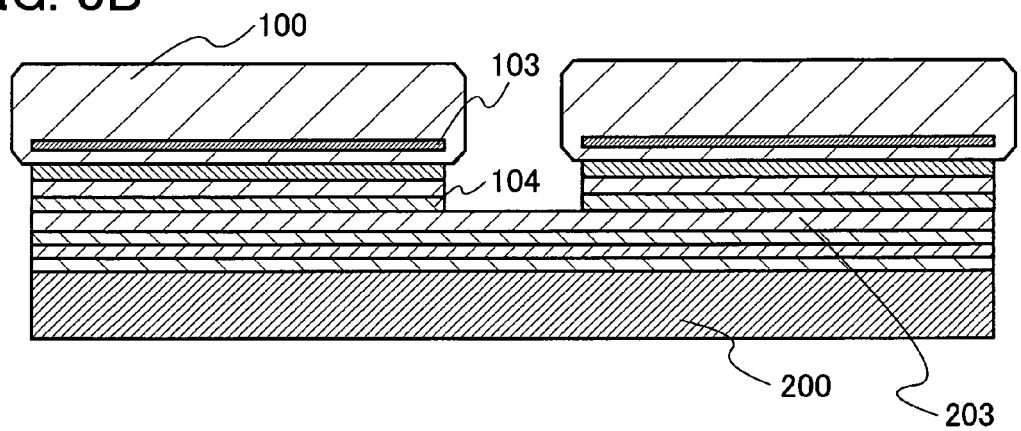
Figure 3C:
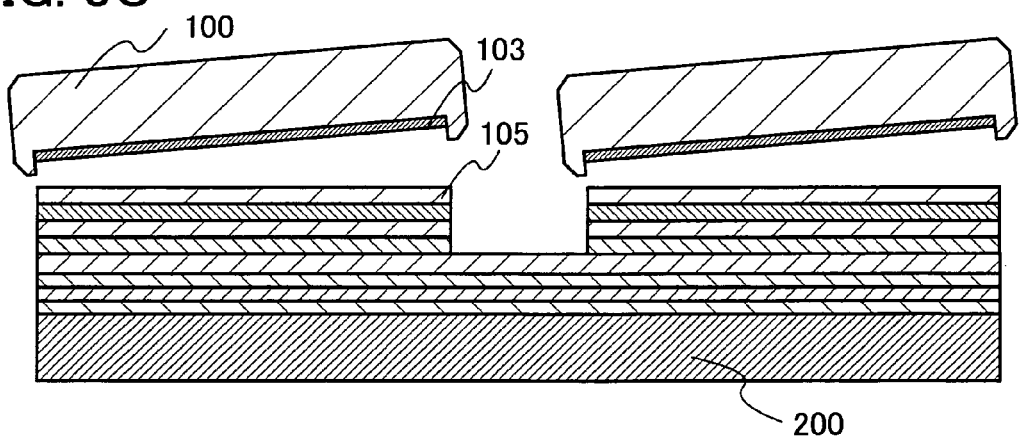

Here, as shown in FIG. 3B, a plurality of the silicon wafers 100 are arranged over the glass substrate 200, and the surface of the glass substrate 200 on the silicon oxide film 203 side and the surface of the silicon wafer 100 on the bonding layer 104 side are attached to each other, and then, as shown in FIG. 3C, heat treatment is performed at 600° C. for 1 to 2 hours to separate a silicon layer. At this time, the thickness of the single-crystal semiconductor layer 105 that remains over the glass substrate 200 depends on the depth of the embrittlement layer 103 formed by the process shown in FIG. 2B. That is, the depth where hydrogen is added by hydrogen ion doping is adjusted so that the thickness of the single-crystal semiconductor layer 105 can be controlled to a thickness of about 100 nm, for example.

Note that, because of a chamfer portion at the end of the silicon wafer 100 as described above or the like, there is a portion where the bonding layer 104 or the like is not formed and at least that portion is not located in close contact with the glass substrate 200; therefore, the area of the single-crystal semiconductor layer 105 that actually remains over the glass substrate 200 is smaller than the silicon wafer 100.

Figure 3D:
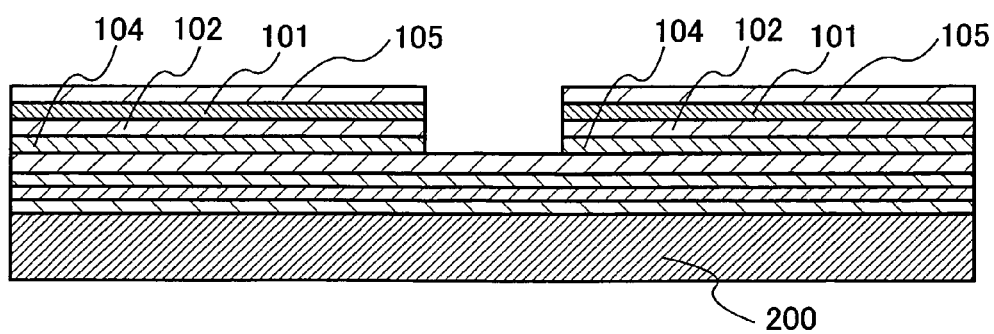

Next, as shown in FIG. 3D, the plurality of single-crystal semiconductor layers 105 are formed over the glass substrate 200 through a similar process. At that time, the boundary between the single-crystal semiconductor layer 105 which is attached in advance and the single-crystal semiconductor layer 105 has a space of about several millimeters to about several centimeters.

Next, the glass substrate 200 is separated from the single-crystal semiconductor layer 105 which is formed as described above.

Figure 4A:
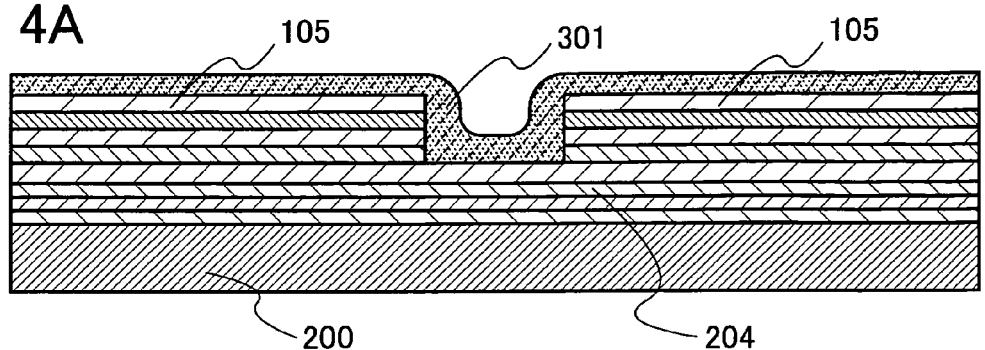
FIGS. 4A to 4D are cross-sectional views showing a manufacturing process of a semiconductor device in Embodiment Mode 1 of the present invention.

First, as shown in FIG. 4A, a protective film 301 is formed over the single-crystal semiconductor layers 105 over the glass substrate 200. The protective film 301 can be formed using silicon oxynitride or silicon oxide. Next, heat treatment is performed at 380° C. to 410° C., for example, at 400° C., whereby the tungsten oxide film 204 has a crystalline state.

Figure 4B:
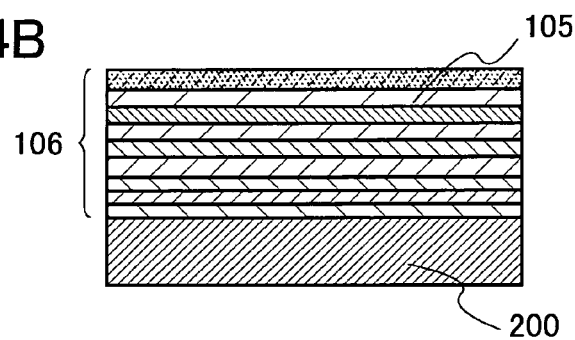

Then, as shown in FIG. 4B, the glass substrate 200 is divided, and a piece of single-crystal semiconductor 106 having a rectangular shape is formed. The division can be performed by a known method using a dicer or the like.

Figure 4C:
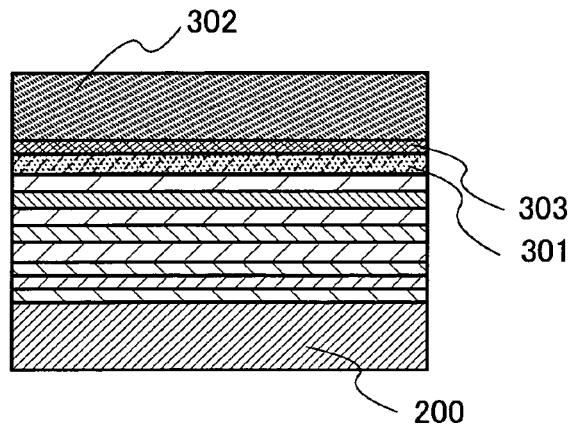

Next, in order to perform separation for convenience, a supporting substrate 302 is used. For example, as shown in FIG. 4C, the supporting substrate 302 is bonded to the protective film 301 over the glass substrate 200 with an adhesive 303. The supporting substrate 302 can be formed using a quartz substrate. Note that the supporting substrate 302 may be provided not only over the protective film 301 but also on the glass substrate 200 side.

Figure 4D:
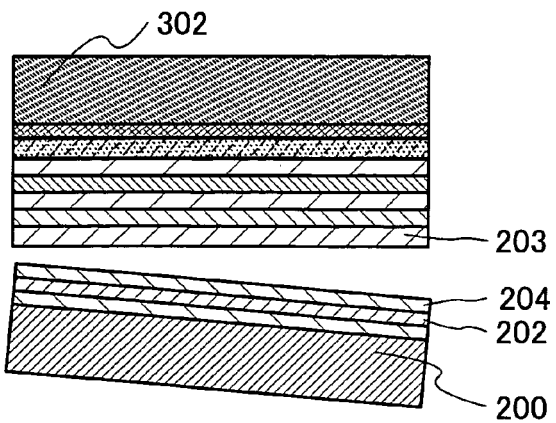

Next, a portion in which the adhesion is reduced, which triggers the start of separation, may be formed. For example, a scratch may be made in a region where separation is performed from the end face of a substrate by a cutter or the like. After such a process, separation occurs in the tungsten oxide film 204 which is crystallized, at the interface between the tungsten oxide film 204 and the tungsten film 202, or at the interface between the tungsten oxide film 204 and the silicon oxide film 203, and the glass substrate 200 can be separated as shown in FIG. 4D.

As for a separating means, a physical means or a chemical means can be used. As the physical means, force may be added to the glass substrate 200 or the supporting substrate 302. As the chemical means, an etchant which is reacted with the tungsten oxide film 204 that is a separation layer but which is not reacted with the other region may be used. As the etchant, there are a gas etchant and a liquid etchant.

When the glass substrate 200 is separated, the tungsten oxide film 204 remains in some cases. In the case where the tungsten oxide film 204 remains, the tungsten oxide film 204 may be removed by etching or the like. At this time, the silicon oxide film 203 which is formed by a sputtering apparatus may also be removed. After a residue or oxide is removed, the piece of single-crystal semiconductor 106 is transferred to the large-sized glass substrate 250, whereby improvement in adherent can be expected.

Figure 5A:
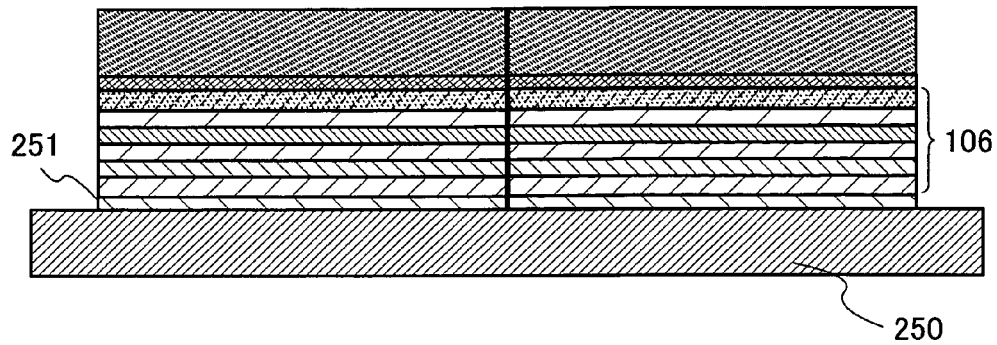
FIGS. 5A to 5D are cross-sectional views showing a manufacturing process of a semiconductor device in Embodiment Mode 1 of the present invention.

Next, as shown in FIG. 5A, a plurality of the pieces of single-crystal semiconductor 106 are arranged over the large-sized glass substrate 250, each of the plurality of the pieces of single-crystal semiconductor 106 is transferred and bonded to the large-sized glass substrate 250 using the adhesive 251. As the adhesive 251 at this time, an ultraviolet curable resin, specifically, an epoxy resin-based adhesive, or an adhesive such as a resin additive or the like can be used. Note that "to transfer" means that an element (including an element on the way to formation) which is formed over the substrate is moved to another substrate.

Figure 5B:
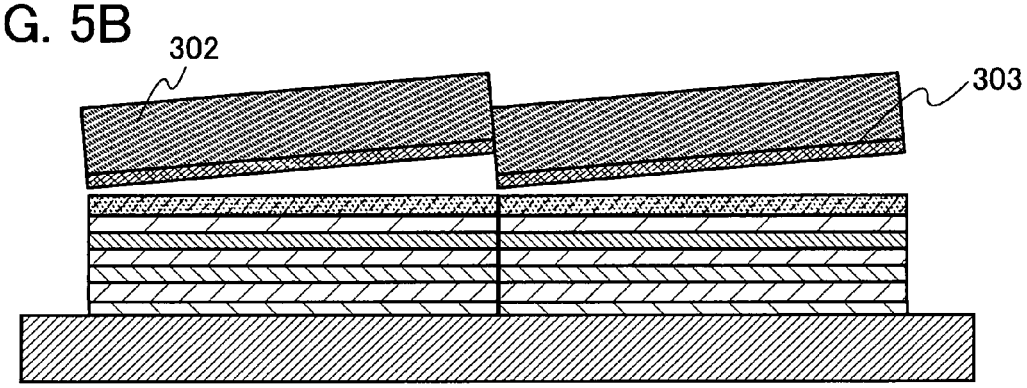

Next, as shown in FIG. 5B, the supporting substrate 302 is separated. As the adhesive 303 which is used for adhesion to the supporting substrate 302 that is necessary to be separated in such a manner, an adhesive which is used for convenient separation, for example, an ultraviolet separation type by which separation is performed using ultraviolet rays, a heat separation type by which separation is performed by heat, a water soluble adhesive which dissolves in water, or the like may be used as an adhesive.

Figure 5C:
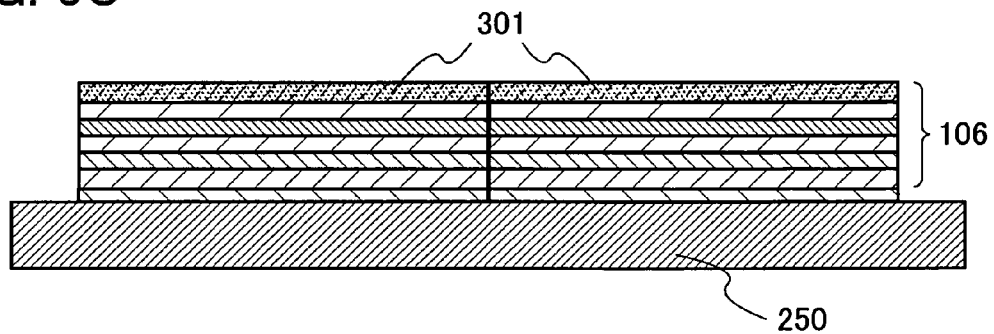
Figure 5D:
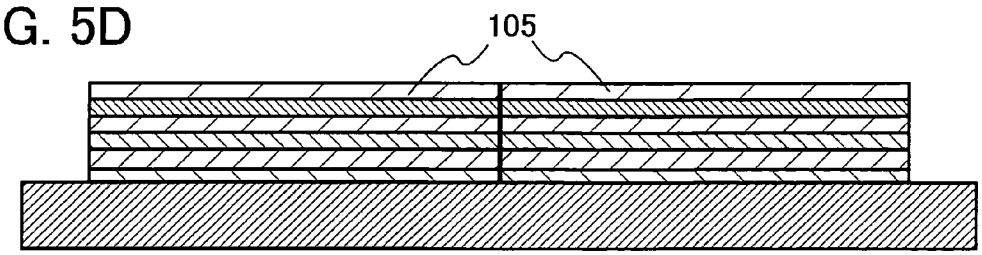

Similarly, as shown in FIG. 5C, a plurality of pieces of single-crystal semiconductor 106 which are separated from the glass substrate 200 that is a dummy substrate are transferred to the large-sized glass substrate 250. At this time, the plurality of pieces of single-crystal semiconductor 106 are arranged so as to be substantially in contact with each other and bonded to the large-sized glass substrate 250. The phrase "to be substantially in contact" means that pieces of single-crystal semiconductor are arranged in contact with each other or arranged with a space of several hundreds of micrometers or less (preferably, 300 μm or less). When transfer of all the pieces of single-crystal semiconductor 106 to the large-sized glass substrate 250 is finished, the protective film 301 is removed as shown in FIG. 5D.

Then, a semiconductor element such as a thin film transistor or the like can be formed by a known process in such a way that the single-crystal semiconductor layer 105 is processed into a desired pattern and a gate electrode is formed thereover, or the like. The thin film transistor or the like which is formed in this manner is used, whereby a semiconductor device such as a liquid crystal display having a large screen, an organic EL display having a large screen, or the like can be formed by a known method.

Through the above manufacturing process, a plurality of single-crystal semiconductor layers are transferred to the large-sized glass substrate; therefore, a plurality of single-crystal semiconductor layers can be arranged in a state that the plurality of single-crystal semiconductor layers are substantially in contact with each other, and a uniform single-crystal semiconductor layer can be formed in a large area.

Next, a manufacturing method, which is different from the method for manufacturing a semiconductor substrate described in this embodiment mode, will be described. Of the steps of the method for manufacturing a semiconductor substrate, the steps which are described with reference to FIGS. 2A to 2C and FIGS. 3A to 3D are similar steps; therefore, description thereof is omitted. Steps after these steps will be described with reference to FIGS. 6A to 6C, FIGS. 7A to 7C, and FIGS. 8A to 8C.

Figure 6A:
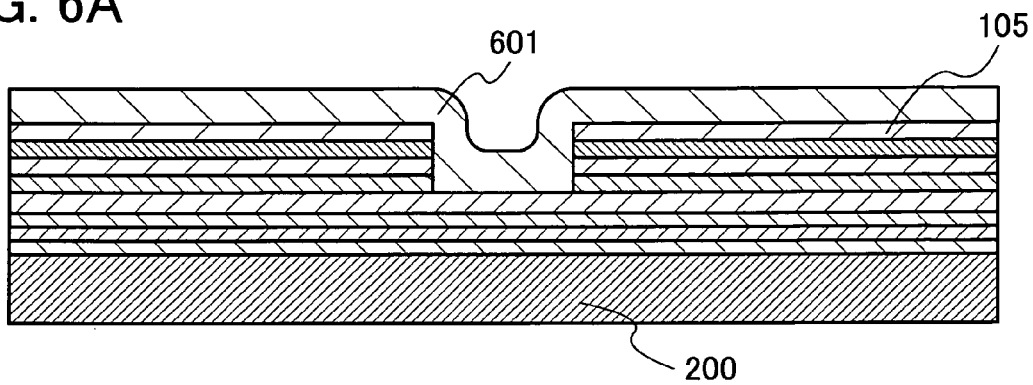
FIGS. 6A to 6C are cross-sectional views showing a manufacturing process of a semiconductor device in Embodiment Mode 1 of the present invention.
Figure 6B:
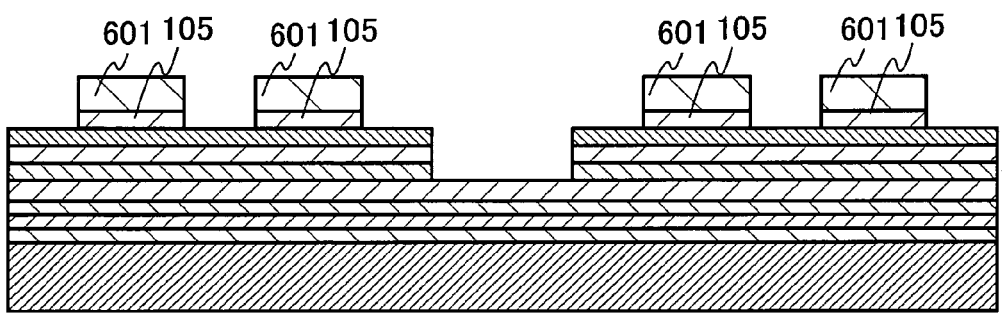
Figure 6C:
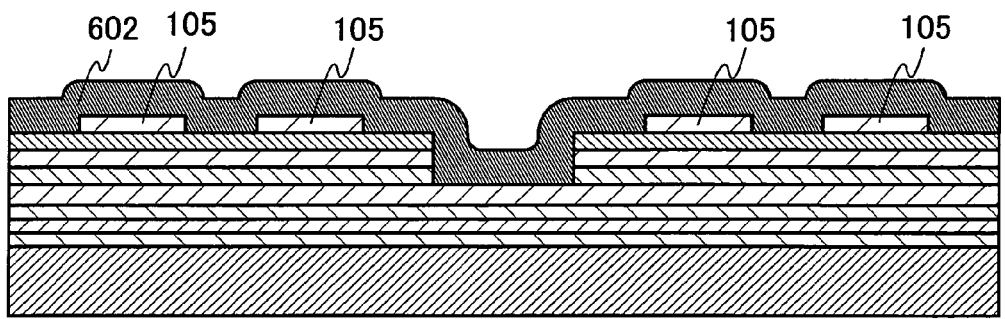

As shown in FIG. 3D, the plurality of single-crystal semiconductor layers 105 are formed over the glass substrate 200 that serves as a dummy substrate with a space of about several millimeters to about several centimeters, and then as shown in FIG. 6A, a silicon nitride film 601 is formed at a thickness of 50 nm to 100 nm over the glass substrate 200 and the single-crystal semiconductor layers 105 by using a plasma CVD apparatus. Next, as shown in FIG. 6B, etching is performed by using a photolithography technique so that the parts of the silicon nitride film 601 and the single-crystal semiconductor layers 105 which serve as island-shaped semiconductor layers are left. Next, as shown in FIG. 6C, the silicon nitride film 601 over the single-crystal semiconductor layers 105 which serve as the island-shaped semiconductor layers is removed, and then, a silicon oxynitride film 602 that serves as a gate insulating film of a thin film transistor is formed by using a plasma CVD apparatus.

Note that the silicon nitride film 601 is provided so as to protect the single-crystal semiconductor layers 105 which serve as the island-shaped semiconductor layers from contamination by a resist, and the silicon nitride film 601 is not limited to a silicon nitride film.

Figure 7A:
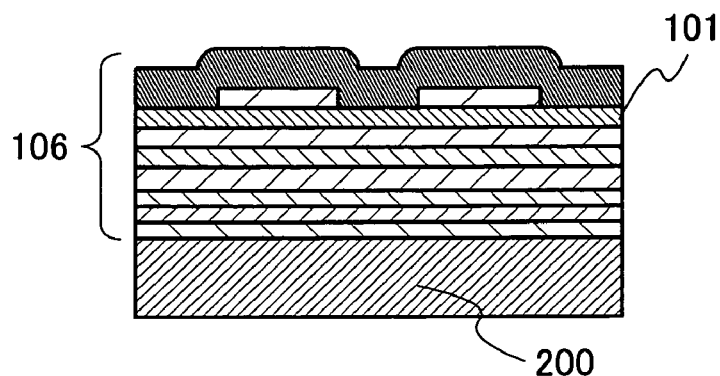
FIGS. 7A to 7C are cross-sectional views showing a manufacturing process of a semiconductor device in Embodiment Mode 1 of the present invention.

Next, the glass substrate 200 is separated. First, as shown in FIG. 7A, the glass substrate 200 is divided, and the piece of single-crystal semiconductor 106 having a rectangular shape is formed. The division can be performed by a known method using a dicer or the like.

Figure 7B:
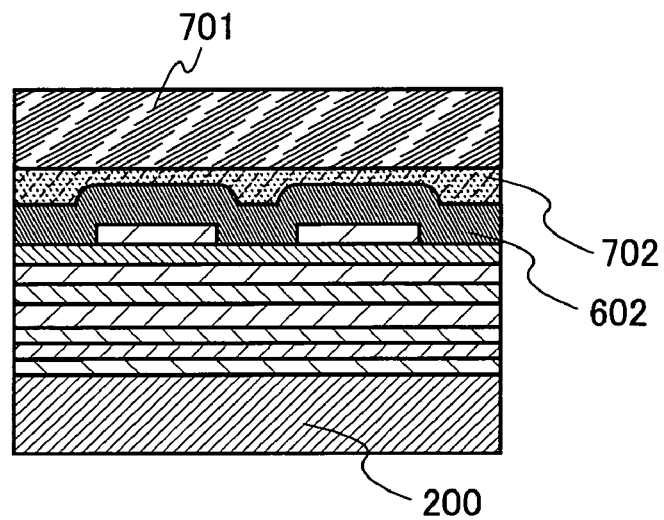

Next, in order to perform separation for convenience, a supporting substrate is used. For example, as shown in FIG. 7B, a supporting substrate 701 is bonded to the silicon oxynitride film 602 over the glass substrate 200 with an adhesive 702. The supporting substrate 701 can be formed using a quartz substrate. Note that the supporting substrate 701 may be provided not only over the silicon oxynitride film 602 but also on the glass substrate 200 side.

Figure 7C:
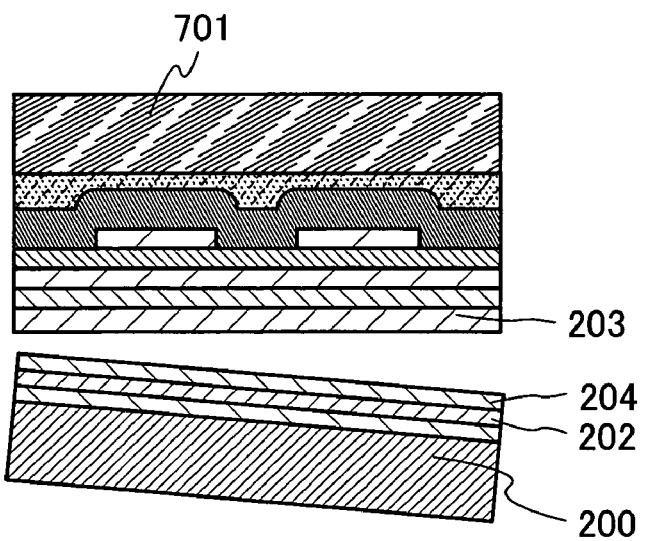

Next, a portion in which the adhesion is reduced, which triggers the start of separation, may be formed. For example, a scratch may be made in a region where separation is performed from the end face of a substrate by a cutter or the like. After such a process, separation occurs in the tungsten oxide film 204 which is crystallized, at the interface between the tungsten oxide film 204 and the tungsten film 202, or at the interface between the tungsten oxide film 204 and the silicon oxide film 203, and the glass substrate 200 can be separated as shown in FIG. 7C.

As for a separating means, a physical means or a chemical means can be used. As the physical means, force may be added to the glass substrate 200 or the supporting substrate 701. As the chemical means, an etchant which is reacted with the tungsten oxide film 204 that is a separation layer but which is not reacted with the other region may be used. As the etchant, there are a gas etchant and a liquid etchant.

When the glass substrate 200 is separated, the tungsten oxide film 204 remains in some cases. In the case where the tungsten oxide film 204 remains, the tungsten oxide film 204 may be removed by etching or the like. At this time, the silicon oxide film 203 which is formed by a sputtering apparatus may also be removed. After a residue or oxide is removed, the piece of single-crystal semiconductor 106 is transferred to the large-sized glass substrate 250, whereby improvement in adherent can be expected.

Figure 8A:
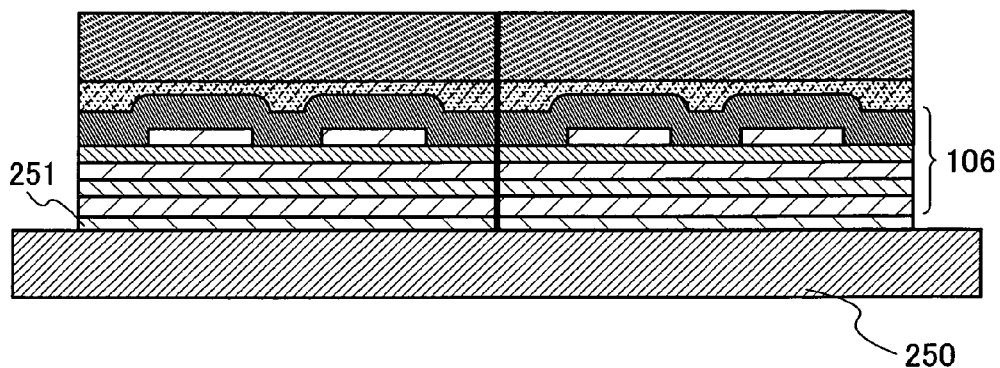
FIGS. 8A to 8C are cross-sectional views showing a manufacturing process of a semiconductor device in Embodiment Mode 1 of the present invention.

Next, as shown in FIG. 8A, the piece of single-crystal semiconductor 106 is transferred and bonded to the large-sized glass substrate 250 using the adhesive 251. As the adhesive at this time, an ultraviolet curable resin, specifically, an epoxy resin-based adhesive, or an adhesive such as a resin additive or the like can be used. Note that "to transfer" means that an element (including an element on the way to formation) which is formed over the substrate is moved to another substrate.

Figure 8B:
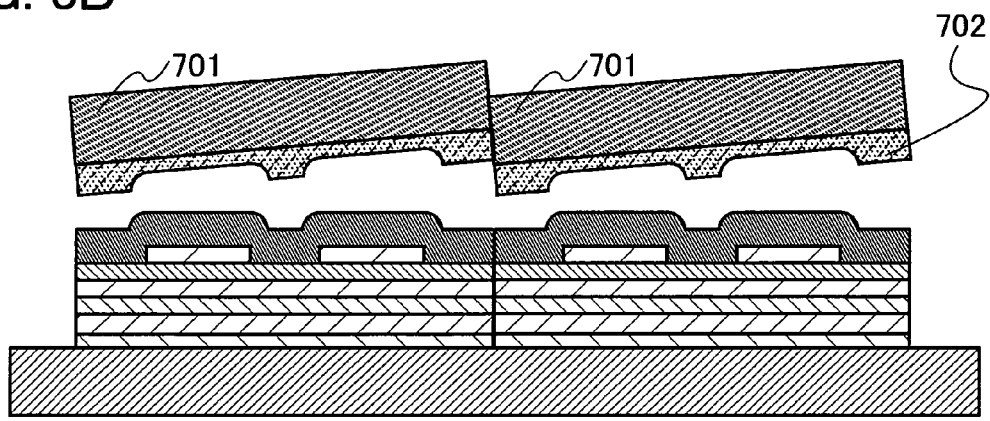

Next, as shown in FIG. 8B, the supporting substrate 701 is separated. As the adhesive 702 which is used for adhesion to the supporting substrate 701 that is necessary to be separated in such a manner, an adhesive which is used for convenient separation, for example, an ultraviolet separation type by which separation is performed using ultraviolet rays, a heat separation type by which separation is performed by heat, a water soluble adhesive which dissolves in water, or the like may be used as an adhesive.

Figure 8C:
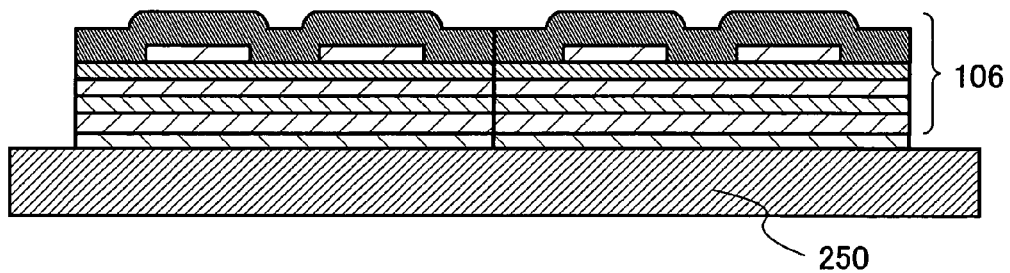

Similarly, as shown in FIG. 8C, the plurality of pieces of single-crystal semiconductor 106 are transferred to the large-sized glass substrate 250. At this time, the plurality of pieces of single-crystal semiconductor 106 are arranged so as to be substantially in contact with each other and bonded to the large-sized glass substrate 250. The phrase "to be substantially in contact" means that pieces of single-crystal semiconductor are arranged in contact with each other or arranged to be bonded with a space of several hundreds of micrometers or less (preferably, 300 μm or less).

Then, a semiconductor element such as a thin film transistor or the like can be formed by a known process. The thin film transistor or the like which is formed in this manner is used, whereby a semiconductor device such as a liquid crystal display having a large screen, an organic EL display having a large screen, or the like can be formed by a known method.

Through the above manufacturing process, a plurality of single-crystal semiconductor layers are transferred to the large-sized glass substrate; therefore, a plurality of single-crystal semiconductor layers can be arranged in a state that the plurality of single-crystal semiconductor layers are substantially in contact with each other, and a uniform single-crystal semiconductor layer can be formed in a large area.

Embodiment Mode 2

In this embodiment mode, a method for transferring a plurality of single-crystal semiconductor films to a large-sized glass substrate without using a supporting substrate, which is different from the method for manufacturing a semiconductor substrate described in Embodiment Mode 1, will be described. FIGS. 9A to 9D, FIGS. 10A and 10B, and FIGS. 11A to 11D are cross-sectional views showing a manufacturing process of a semiconductor device in this embodiment mode.

Figure 9A:
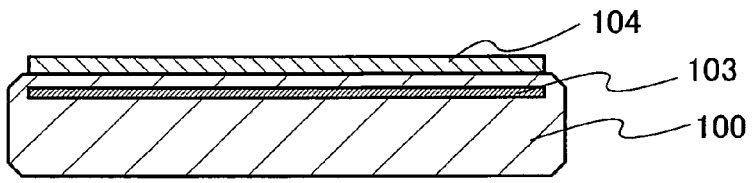
FIGS. 9A to 9D are cross-sectional views showing a manufacturing process of a semiconductor device in Embodiment Mode 2 of the present invention.

First, as shown in FIG. 9A, the embrittlement layer 103 is formed in the silicon wafer 100, and the bonding layer 104 is formed over the silicon wafer 100.

Figure 9B:
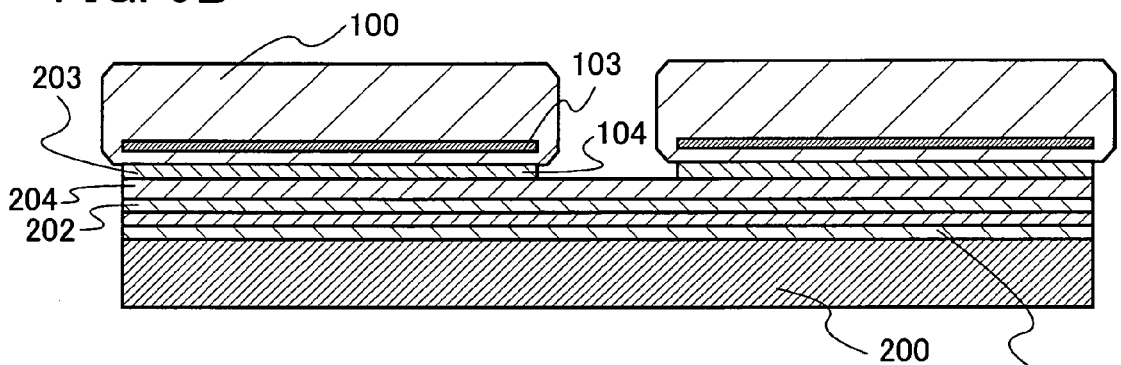

Next, as shown in FIG. 9B, a plurality of the silicon wafers 100 are arranged over the glass substrate 200, and the surface of the silicon wafer 100 on the bonding layer 104 side is attached to the surface of the glass substrate 200 which is provided with the silicon oxynitride film 201, the tungsten film 202, the tungsten oxide film 204, and the silicon oxide film 203 on the silicon oxide film 203 side.

Figure 9C:
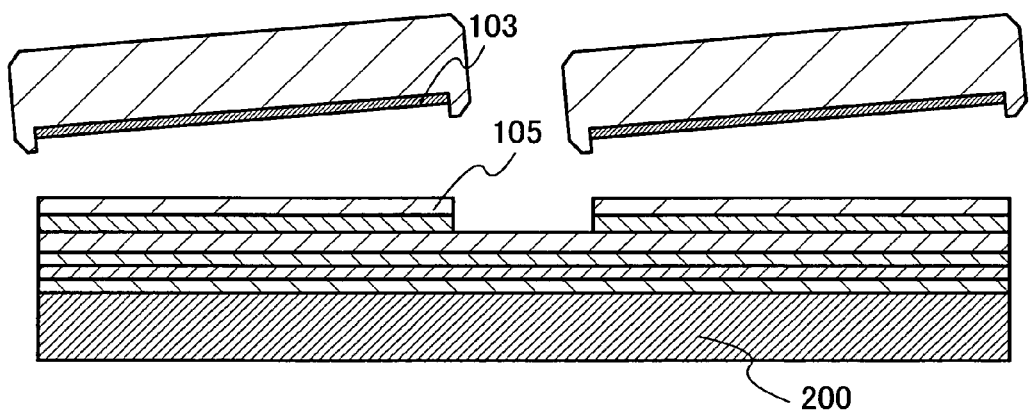

Next, as shown in FIG. 9C, heat treatment is performed at 600° C. for 1 to 2 hours to separate a silicon layer. At this time, the thickness of the single-crystal semiconductor layer 105 that remains over the glass substrate 200 depends on the depth of the embrittlement layer 103 formed by the process shown in FIG. 9A.

Figure 9D:
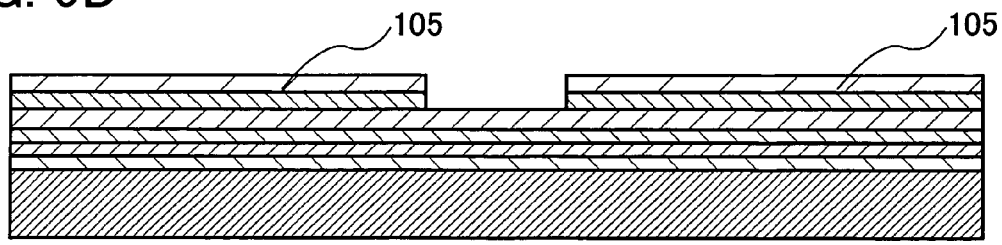

Further, as shown in FIG. 9D, the plurality of single-crystal semiconductor layers 105 are formed over the glass substrate 200 through a similar process. At that time, the boundary between the single-crystal semiconductor layer 105 which is attached in advance and the single-crystal semiconductor layer 105 has a space of about several millimeters to about several centimeters.

Next, the glass substrate 200 is separated from the single-crystal semiconductor layer 105 which is formed as described above.

Figure 10A:
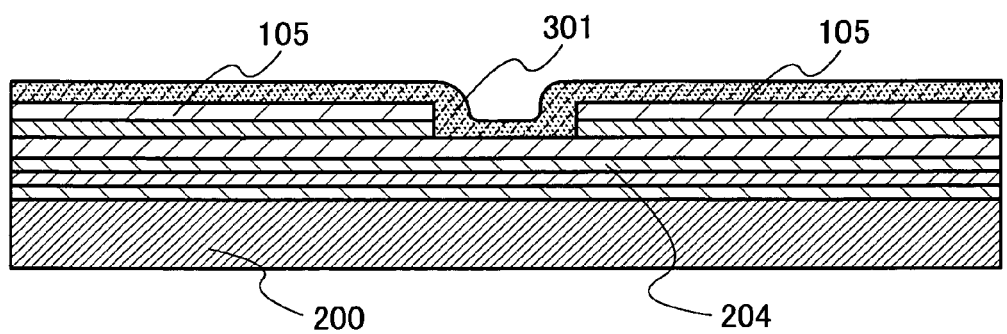
FIGS. 10A and 10B are cross-sectional views showing a manufacturing process of a semiconductor device in Embodiment Mode 2 of the present invention.

First, as shown in FIG. 10A, the protective film 301 is formed over the single-crystal semiconductor layers 105 over the glass substrate 200. The protective film 301 can be formed using silicon oxynitride or silicon oxide. Next, heat treatment is performed at 380° C. to 410° C., for example, at 400° C., whereby the tungsten oxide film 204 has a crystalline state.

Figure 10B:
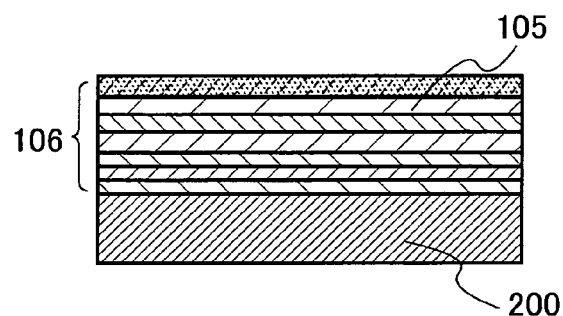

Then, as shown in FIG. 10B, the glass substrate 200 is divided, and the piece of single-crystal semiconductor 106 having a rectangular shape is formed. The division can be performed by a known method using a dicer or the like.

Figure 11A:
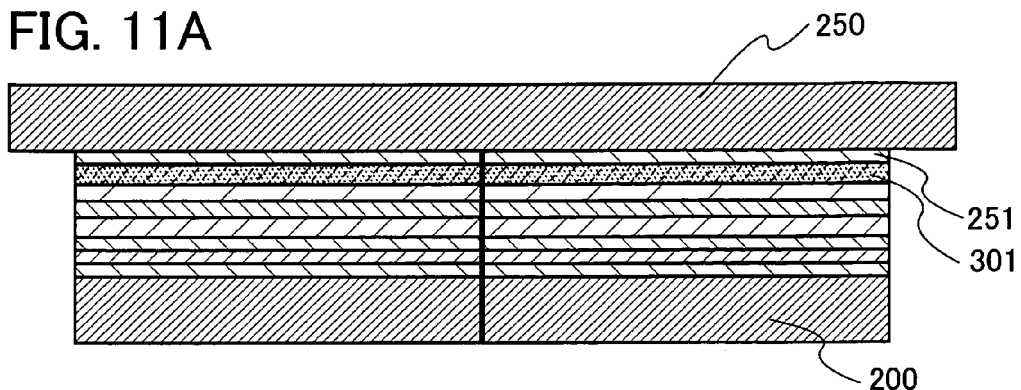
FIGS. 11A to 11D are cross-sectional views showing a manufacturing process of a semiconductor device in Embodiment Mode 2 of the present invention.

The piece of single-crystal semiconductor 106 is formed and arranged over the large-sized glass substrate 250, and then the large-sized glass substrate 250 is bonded to the protective film 301 over the glass substrate 200 with the adhesive 251, as shown in FIG. 11A. At this time, an ultraviolet curable resin, specifically, an epoxy resin-based adhesive, or an adhesive such as a resin additive or the like can be used for the adhesive 251. Alternatively, if the planarity of the protective film 301 is sufficient, the large-sized glass substrate 250 may be directly bonded to the protective film 301 over the glass substrate 200 without using the adhesive 251. Further, the large-sized glass substrate 250 may be provided with a silicon oxynitride film, a silicon nitride oxide film, or the like.

Figure 11B:
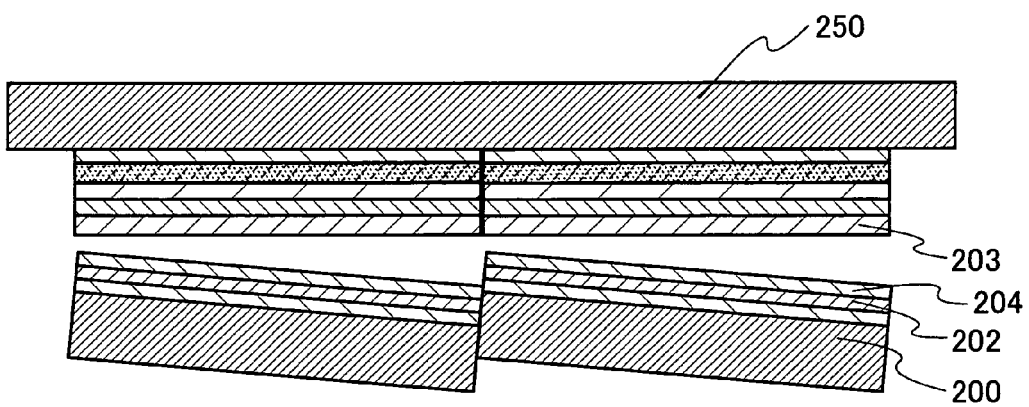

Next, a portion in which the adhesion is reduced, which triggers the start of separation, may be formed. For example, a scratch may be made in a region where separation is performed from the end face of a substrate by a cutter or the like. After such a process, separation occurs in the tungsten oxide film 204 which is crystallized, at the interface between the tungsten oxide film 204 and the tungsten film 202, or at the interface between the tungsten oxide film 204 and the silicon oxide film 203, and the glass substrate 200 can be separated as shown in FIG. 11B.

As for a separating means, a physical means or a chemical means can be used. As the physical means, force may be added to the glass substrate 200. As the chemical means, an etchant which is reacted with the tungsten oxide film 204 that is a separation layer but which is not reacted with the other region may be used. As the etchant, there are a gas etchant and a liquid etchant.

Figure 11C:
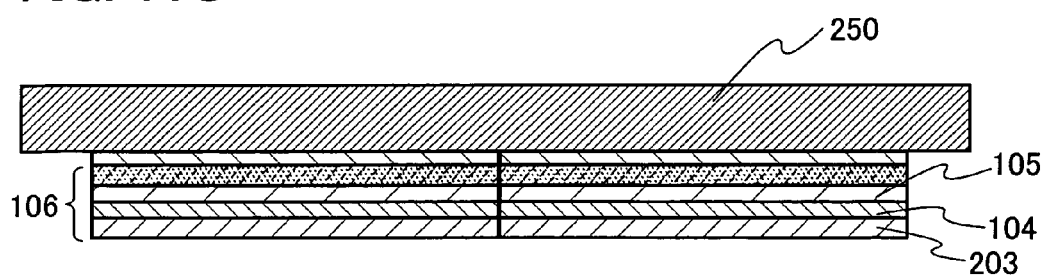
Figure 11D:
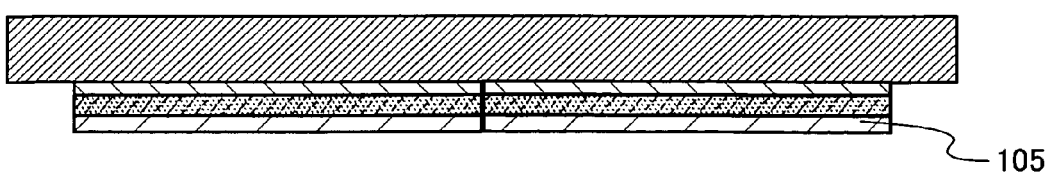

Similarly, as shown in FIG. 11C, the plurality of pieces of single-crystal semiconductor 106 which are separated from the glass substrate 200 that is a dummy substrate are transferred to the large-sized glass substrate 250. At this time, the plurality of pieces of single-crystal semiconductor 106 are arranged so as to be substantially in contact with each other and bonded to the large-sized glass substrate 250. The phrase "to be substantially in contact" means that pieces of single-crystal semiconductor are arranged in contact with each other or arranged with a space of several hundreds of micrometers or less (preferably, 300 μm or less). When transfer of all the pieces of single-crystal semiconductor 106 to the large-sized glass substrate 250 is finished, as shown in FIG. 11D, the silicon oxide film 203 and the bonding layer 104 are removed by etching or the like, and the surface of the single-crystal semiconductor layer 105 is exposed.

Then, a semiconductor element such as a thin film transistor or the like can be formed by a known process in such a way that the single-crystal semiconductor layer 105 is processed into a desired pattern and a gate electrode is formed thereover, or the like. The thin film transistor or the like which is formed in this manner is used, whereby a semiconductor device such as a liquid crystal display having a large screen, an organic EL display having a large screen, or the like can be formed by a known method.

Through the above manufacturing process, a plurality of single-crystal semiconductor layers are transferred to the large-sized glass substrate; therefore, a plurality of single-crystal semiconductor layers can be arranged in a state that the plurality of single-crystal semiconductor layers are substantially in contact with each other, and a uniform single-crystal semiconductor layer can be formed in a large area.

Embodiment Mode 3

In this embodiment mode, an example will be described in which a semiconductor device is manufactured using a plurality of single-crystal semiconductor layers which is formed over a large-sized glass substrate, which is manufactured according to Embodiment Mode 1 or 2.

A semiconductor device having a light-emitting element can be formed according to the present invention, and the light-emitting element emits light by any one of bottom emission, top emission, or dual emission. This embodiment mode describes an example of a method for manufacturing a semiconductor device with high yield, in which a semiconductor device having a display function (also referred to as a display device or a light-emitting device) is manufactured as a bottom-emission, dual-emission, or top-emission semiconductor device with high performance and high reliability, with reference to FIGS. 12A and 12B, and FIG. 13.

Figures 12A, 12B:
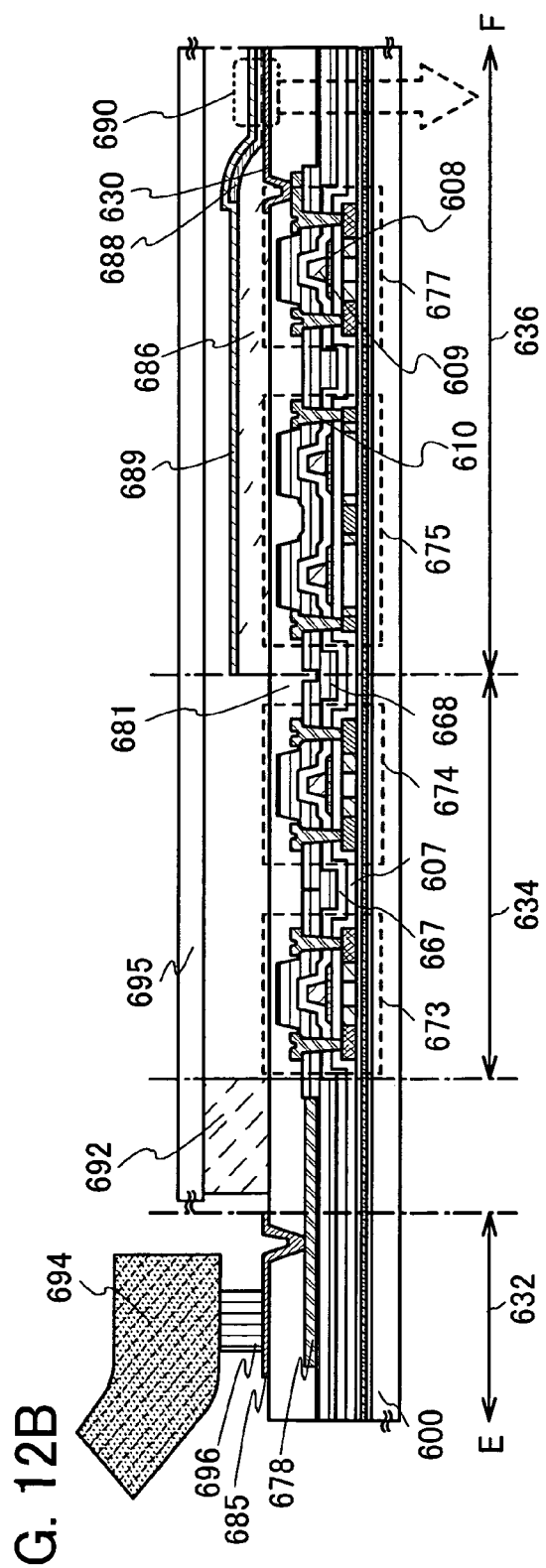
FIGS. 12A and 12B are top view and a cross-sectional view each showing a structure of an active matrix EL display device in Embodiment Mode 3 of the present invention.

In FIGS. 12A and 12B, a structure of a semiconductor device in this embodiment mode is shown. FIG. 12A is a plan view of the semiconductor device, and FIG. 12B is a cross-sectional view taken along line E-F in FIG. 12A. In FIG. 12A, an external terminal connection region 632 that is an attachment portion of an FPC 694, a supporting substrate 600, a sealing substrate 695, a sealant 692, a connection region 655, a peripheral drive circuit region 634, and a pixel region 636 are shown. As shown in FIG. 12B, the external terminal connection region 632 is provided with a terminal electrode layer 678 which is connected to an external terminal. In addition, the FPC 694 is connected to the terminal electrode layer 678 through an anisotropic conductive layer 696 and an electrode layer 685. Here, the electrode layer 685 is formed by the same process as that of a pixel electrode layer 630. Note that the connection region 655 is a region where a second electrode layer 689 is connected to a lower wiring.

First, an island-shaped single-crystal semiconductor layer and a gate insulating film 607 that covers the island-shaped single-crystal semiconductor layer are formed over the supporting substrate 600 that is a glass substrate, according to Embodiment Mode 1 or 2. Note that, since details of the method are described in Embodiment Mode 1 or 2, they are omitted here and the method is described briefly.

The gate insulating film 607 is formed of an insulating film including silicon with a thickness of 10 nm to 150 nm which is formed by a plasma CVD method, a sputtering method, or the like. The gate insulating film 607 may be formed by using a material such as oxide or nitride of silicon, typified by silicon nitride, silicon oxide, silicon oxynitride, or silicon nitride oxide, and may have a stacked structure or a single-layer structure. For example, the gate insulating film 607 may be a stacked layer of three layers including a silicon nitride film, a silicon oxide film, and a silicon nitride film; a single layer of a silicon oxynitride film; or a stacked layer of two layers. Preferably, a silicon nitride film with dense film quality may be used. A thin silicon oxide film with a thickness of 1 nm to 100 nm, preferably 1 nm to 10 nm, and more preferably 2 nm to 5 nm may be formed between the single-crystal semiconductor layer and the gate insulating film 607. A thin silicon oxide film can be formed in such a way that the surface of the semiconductor region is oxidized by a GRTA method, an LRTA method, or the like to form a thermal oxide film. Note that a noble gas element such as argon or the like may be contained in a reaction gas and be mixed into an insulating film to be formed in order to form a dense insulating film having less gate leakage current at a low film formation temperature.

Next, a first conductive film 608 having a thickness of 20 nm to 100 nm and a second conductive film 609 having a thickness of 100 nm to 400 nm, which serves as a gate electrode layer or a connection electrode, are stacked over the gate insulating film 607. The first conductive film 608 and the second conductive film 609 can be formed by a sputtering method, an evaporation method, a CVD method, or the like. The first conductive film 608 and the second conductive film 609 may be formed of an element selected from tantalum (Ta), tungsten (W), titanium (Ti), molybdenum (Mo), aluminum (Al), copper (Cu), chromium (Cr), or neodymium (Nd), or an alloy or a compound including any of those elements as its main component. A semiconductor film typified by a polycrystalline silicon film that is doped with an impurity element such as phosphorus or a film formed of an AgPdCu alloy may also be used as the first conductive film 608 and the second conductive film 609. The conductive film is not limited to the two-layer structure, and for example, may have a three-layer structure in which a tungsten film of 50 nm thick as the first conductive film 608, an aluminum-silicon (Al—Si) alloy film of 500 nm thick as the second conductive film 609, and a titanium nitride film of 30 nm thick as a third conductive film are sequentially stacked. In a case of a three-layer structure, a tungsten nitride film may be used instead of a tungsten film as the first conductive film 608; an aluminum-titanium (Al—Ti) alloy film may be used instead of an aluminum-silicon (Al—Si) alloy film as the second conductive film 609; or a titanium film may be used instead of a titanium nitride film as the third conductive film. Note that a conductive film may have a single-layer structure.

Then, a photolithography method is employed to form a mask formed of a resist and to process the first conductive film 608 and the second conductive film 609 into a desired shape. Etching can be performed by an inductively coupled plasma (ICP) etching method by adjusting etching conditions (the amount of electric power applied to a coil-shaped electrode layer, the amount of electric power applied to an electrode layer on a substrate side, an electrode temperature on the substrate side, and the like) as appropriate so that the first conductive film 608 and the second conductive film 609 have a desired taper shape. As an etching gas, a chlorine-based gas typified by chlorine, boron trichloride, silicon tetrachloride, carbon tetrachloride, or the like; a fluorine-based gas typified by carbon tetrafluoride, sulfur hexafluoride, nitrogen trifluoride, or the like; or oxygen can be used as appropriate. In this embodiment mode, the second conductive film 609 is etched using an etching gas containing carbon tetrafluoride, chlorine, and oxygen, and the first conductive film 608 is successively etched using an etching gas containing carbon tetrafluoride and chlorine.

Then, the second conductive film 609 is further processed to have a taper angle larger than a taper angle of a side surface of the first conductive film 608 using the mask formed of a resist which is used in the foregoing etching process. In this embodiment mode, chlorine, sulfur hexafluoride, and oxygen are used as an etching gas for forming a conductive film having a tapered shape. With a tapered shape, coverage of a film to be stacked thereover is improved and a defect is reduced, and thus, reliability is improved. Thus, an electrode having a shape shown in FIGS. 12A and 12B is formed, that is, an electrode in which the second conductive film 609 having a smaller width than the first conductive film 608 and has a tapered shape is provided over the first conductive film 608 is formed. This electrode is formed over the island-shaped single-crystal semiconductor layer and serves as a gate electrode or a connection electrode for connection with another wiring.

Note that the shape of the gate electrode is not limited to the one shown in FIGS. 12A and 12B. The gate electrode may have a single-layer structure or an electrode structure having a sidewall structure on its side wall.

Then, a first n-type impurity region is formed by adding an impurity element imparting n-type conductivity to the island-shaped single-crystal semiconductor layer using the second conductive film 609 as a mask. In this embodiment mode, doping is performed using phosphine as a doping gas containing an impurity element (the doping gas is phosphine diluted with hydrogen, and the phosphine rate in the gas is 5%). Phosphorus is used as an impurity element imparting n-type conductivity in this embodiment mode.

In this embodiment mode, regions in impurity regions, which overlap with the first conductive film 608 and the second conductive film 609 with the gate insulating film 607 interposed therebetween, are referred to as Lov regions. Further, regions in impurity regions, which do not overlap with the first conductive film 608 and the second conductive film 609 with the gate insulating film 607 interposed therebetween, are referred to as Loff regions. In FIGS. 12A and 12B, the impurity regions are shown by hatching and blank spaces (or dotted hatching). This does not mean that the blank spaces (or dotted hatching) are not doped with impurity elements, but makes it easy to understand that the concentration distribution of the impurity element in these regions reflects the mask and doping condition. Note that the same can be said for the other drawings of this specification.

Then, a mask formed of a resist, which covers an island-shaped single-crystal semiconductor layer which is to be included in a p-channel TFT and an island-shaped single-crystal semiconductor layer which is to be included in a switching TFT in a pixel portion, is formed. Then, a second n-type impurity region is formed by adding an impurity element imparting n-type conductivity to the island-shaped single-crystal semiconductor layer through the mask. In this embodiment mode, doping is performed using phosphine as a doping gas containing an impurity element (the doping gas is phosphine diluted with hydrogen, and the phosphine rate in the gas is 5%). The second n-type impurity region is a high concentration n-type impurity region which functions as a source or drain of a TFT. A third n-type impurity region which is doped with an impurity element imparting n-type conductivity to the island-shaped single-crystal semiconductor layer through the first conductive film 608 is a low concentration impurity region which functions as a lightly doped drain (LDD) region. The third n-type impurity region is an Lov region, which can relieve an electric field around a drain and suppress deterioration of an on current due to hot carriers.

Then, the mask, which covers the island-shaped single-crystal semiconductor layer which is to be included in a p-channel TFT and the island-shaped single-crystal semiconductor layer which is to be included in a switching TFT in a pixel portion is removed and a mask formed of a resist which covers an island-shaped single-crystal semiconductor layer which is to be included in an n-channel TFT is formed. Then, a p-type impurity region is formed by adding an impurity element imparting p-type conductivity to the island-shaped single-crystal semiconductor layer through the mask. Since boron is used as an impurity element in this embodiment mode, doping is performed using diborane as a doping gas containing an impurity element (the doping gas is diborane diluted with hydrogen, and the diborane rate in the gas is 15%). The p-type impurity region is a high concentration p-type impurity region which functions as a source or drain of a TFT.

Next, the mask which covers the island-shaped single-crystal semiconductor layer which is to be included in an n-channel TFT is removed by $O_2$ ashing or using a resist stripping solution, and an oxide film is also removed. After that, an insulating film, that is, a so-called sidewall may be formed to cover a side surface of the first conductive film 608 and the second conductive film 609. The sidewall can be formed of an insulating film including silicon which is formed by a plasma CVD method or a low pressure CVD (LPCVD) method.

Then, heat treatment, intense light irradiation, or laser beam irradiation may be performed in order to activate the impurity element. Note that, at the same time as the activation, plasma damage to the gate insulating film 607 and plasma damage to an interface between the gate insulating film 607 and the island-shaped single-crystal semiconductor layer can be repaired.

Next, a first interlayer insulating film which covers the first conductive film 608, the second conductive film 609, and the gate insulating film 607 is formed. In this embodiment mode, a stacked structure of insulating films 667 and 668 is employed as the first interlayer insulating film. The insulating film 667 which is formed of a silicon nitride oxide film and has a thickness of 100 nm and the insulating film 668 which is formed of a silicon oxynitride film and has a thickness of 900 nm are successively formed by a plasma CVD method. Materials for the insulating films 667 and 668 are not limited to the foregoing materials. The insulating films 667 and 668 may be a silicon nitride film, a silicon nitride oxide film, a silicon oxynitride film, or a silicon oxide film which is formed by a sputtering method or a plasma CVD method. A single-layer structure or a stacked structure of three or more layers using another insulating film including silicon may be employed.

The insulating films 667 and 668 can alternatively be formed of a material selected from aluminum nitride, aluminum oxynitride, aluminum nitride oxide containing more nitrogen than oxygen, aluminum oxide, diamond-like carbon, a nitrogen-containing carbon film, or another substance containing an inorganic insulating material. Alternatively, a siloxane resin may be used for the insulating films 667 and 668. Note that a siloxane resin is a resin including a Si—O—Si bond. Siloxane has a skeletal structure formed of a bond of silicon (Si) and oxygen (O) and has an organic group containing at least hydrogen (e.g., an alkyl group or an aryl group) or a fluoro group as a substituent. Alternatively, a fluoro group may be included in the organic group. Alternatively, an organic insulating material such as polyimide, acrylic, polyamide, polyimide amide, resist, benzocyclobutene, or polysilazane can be used for the insulating films 667 and 668. A coating film with a favorable planarity formed by a coating method may be used.

Next, a plurality of contact holes (openings) which reaches the island-shaped single-crystal semiconductor layers or the gate electrode layers is formed by selectively etching the insulating films 667 and 668 and the gate insulating film 607 using a mask formed of a resist. Etching may be performed once or plural times depending on a selectivity of a material to be used.

Then, a conductive film is formed to cover the openings, and the conductive film is etched to form connection electrodes 610 which are electrically connected to parts of a source region and a drain region.

The connection electrodes 610 can be formed by forming a conductive film by a PVD (physical vapor deposition) method, a CVD method, an evaporation method, or the like, and then, etching the conductive film into a desired shape. A conductive film can be selectively formed in a predetermined position by a droplet discharge method, a printing method, an electroplating method, or the like. A reflow method or a damascene method may be employed. The connection electrodes 610 can be formed of a metal such as silver, gold, copper, nickel, platinum, palladium, iridium, rhodium, tungsten, aluminum, tantalum, molybdenum, cadmium, zinc, iron, titanium, zirconium, or barium, silicon, germanium, or an alloy or nitride thereof. A stacked structure of any of those materials may alternatively be employed. In this embodiment mode, as the connection electrodes 610, a titanium film is formed to be 60 nm thick, a titanium nitride film is formed to be 40 nm thick, an aluminum film is formed to be 700 nm thick, and a titanium film is formed to be 200 nm thick, and then, thus formed stacked structure is processed into a desired shape.

Through the above-described process, an active matrix substrate can be manufactured, in which the peripheral drive circuit region 634 includes a p-channel TFT 673 having a p-type impurity region in an Lov region and an n-channel TFT 674 having an n-type impurity region in an Lov region; and the pixel region 636 includes a multi-channel type n-channel TFT 675 having an n-type impurity region in an Loff region and a p-channel TFT 677. The active matrix substrate can be used for a display device including a light-emitting element 690.

Note that a method for manufacturing a semiconductor device which is described in this embodiment mode can be applied to not only a TFT which is described in this embodiment mode but also a TFT having a top gate type (a planar type), a bottom gate type (an inversely staggered type), a dual gate type having two gate electrode layers which are arranged above and below a channel region each with a gate insulating film interposed therebetween, and other structures.

Then, a second interlayer insulating film 681 is formed. The second interlayer insulating film 681 can be formed of a material selected from silicon oxide, silicon nitride, silicon oxynitride, silicon nitride oxide, aluminum nitride, aluminum oxynitride, aluminum nitride oxide containing more nitrogen than oxygen, aluminum oxide, diamond-like carbon, a nitrogen-containing carbon film, phosphosilicate glass, borophosphosilicate glass, an alumina film, polysilazane, or another substance containing an inorganic insulating material. Alternatively, a siloxane resin may be used to form the second interlayer insulating film 681. An organic insulating material which is either photosensitive or nonphotosensitive may be used to form the second interlayer insulating film 681. For example, polyimide, acrylic, polyamide, polyimide amide, resist, or benzocyclobutene can be used.

In this embodiment mode, the interlayer insulating film is required to have a high heat resistant property, a high insulating property, and high planarity. Therefore, the second interlayer insulating film 681 is preferably formed by using a coating method typified by a spin coating method.

As a method for forming the second interlayer insulating film 681, dipping, spray coating, a doctor knife, a roll coater, a curtain coater, a knife coater, a CVD method, an evaporation method, or the like can be used. The second interlayer insulating film 681 may be formed by a droplet discharge method. In the case of using a droplet discharge method for forming the second interlayer insulating film 681, a liquid material can be saved. A method for forming a pattern without a mask like a droplet discharge method, for example, a printing method (i.e., a method for forming a pattern such as screen printing or offset printing) or the like can be used to form the second interlayer insulating film 681.

Next, an opening which reaches the connection electrode 610 of the p-channel transistor 677, that is, a contact hole is formed by etching part of the second interlayer insulating film 681 in the pixel region 636.

Next, the pixel electrode layer 630 which is electrically connected to the connection electrode 610 is formed. The pixel electrode layer 630 serves as a first electrode which is one of two electrodes which is included in the light-emitting element 690. The pixel electrode layer 630 can be formed using indium tin oxide, indium zinc oxide (IZO) in which zinc oxide is mixed with indium oxide, a conductive material in which silicon oxide is mixed with indium oxide, organic indium, organotin, indium oxide containing tungsten oxide, indium zinc oxide containing tungsten oxide, indium oxide containing titanium oxide, or indium tin oxide containing titanium oxide.

A conductive composition including a conductive high molecule (also referred to as a conductive polymer) can be used for the pixel electrode layer 630. When a thin film of a conductive composition is formed as the pixel electrode layer 630, the thin film preferably has sheet resistance of less than or equal to 10000 Ω/square and light transmittance of higher than or equal to 70% at a wavelength of 550 nm. Note that resistance of a conductive high molecule which is included in the conductive composition is preferably lower than or equal to 0.1 Ω·cm.

As a conductive high molecule, so-called π electron conjugated high molecule can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive high molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), or poly (3-anilinesulfonic acid).

Any of the foregoing conductive high molecules may be used alone as a conductive composition for the pixel electrode layer 630. Alternatively, any of the foregoing conductive high molecules may be used with an organic resin added thereto to adjust film characteristics such as the intensity of the film of a conductive composition or the like.

As for an organic resin, as long as a resin is compatible to a conductive high molecule or a resin can be mixed and dispersed into a conductive high molecule, any of a thermosetting resin, a thermoplastic resin, or a photocurable resin may be used. For example, a polyester-based resin such as polyethylene terephthalate, polybutylene terephthalate, or polyethylene naphthalate; a polyimide-based resin such as polyimide or polyimide amide; a polyamide resin such as polyamide 6, polyamide 66, polyamide 12, or polyamide 11; a fluorine resin such as poly(vinylidene fluoride), polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of those resins.

Further, a conductive composition may be doped with an acceptor dopant or a donor dopant so that oxidation-reduction potential of a conjugated electron in a conjugated conductive high molecule may be changed in order to adjust conductivity of the conductive composition.

A halogen compound, a Lewis acid, a protonic acid, an organic cyano compound, an organic metal compound, or the like can be used as an acceptor dopant. Examples of a halogen compound are chlorine, bromine, iodine, iodine chloride, iodine bromide, and iodine fluoride. Examples of a Lewis acid are phosphorus pentafluoride, arsenic pentafluoride, antimony pentafluoride, boron trifluoride, boron trichloride, and boron tribromide. Examples of a protonic acid include an inorganic acid such as hydrochloric acid, sulfuric acid, nitric acid, phosphoric acid, fluoroboric acid, hydrofluoric acid, and perchloric acid; and an organic acid such as organic carboxylic acid and organic sulfonic acid. As organic carboxylic acid and organic sulfonic acid, the foregoing organic carboxylic acid compound and an organic sulfonic acid compound can be used. As an organic cyano compound, a compound having two or more cyano groups in a conjugated bonding, for example, tetracyanoethylene, tetracyanoethylene oxide, tetracyanobenzene, tetracyanoquinodimethane, and tetracyanoazanaphthalene are given.

As a donor dopant, alkali metal, alkaline-earth metal, a quaternary amine compound, or the like can be used.

A conductive composition is dissolved in water or an organic solvent (e.g., an alcohol-based solvent, a ketone-based solvent, an ester-based solvent, a hydrocarbon-based solvent, an aromatic-based solvent) and a thin film which serves as the pixel electrode layer 630 can be formed by a wet process.

A solvent which dissolves a conductive composition is not particularly limited. A solvent which dissolves the foregoing conductive high molecules and high molecular resin compounds such as an organic resin may be used. For example, a conductive composition may be dissolved in any one of or mixture of water, methanol, ethanol, propylene carbonate, N-methylpyrrolidone, dimethylformamide, dimethylacetamide, cyclohexanone, acetone, methyl ethyl ketone, methyl isobutyl ketone, or toluene.

After the conductive composition is dissolved in a solvent as described above, a film thereof can be formed by a wet process, such as an application method, a coating method, a droplet discharge method (also referred to as an inkjet method), or a printing method. The solvent may be dried with thermal treatment or may be dried under reduced pressure. In the case where the organic resin is a thermosetting resin, heat treatment may be further performed. In the case where the organic resin is a photocurable resin, light irradiation treatment may be performed.

Then, an insulating layer 686 which serves as a partition wall which covers an edge of the pixel electrode layer 630 is formed.

Then, a layer 688 including an organic compound is formed as selected over the pixel electrode layer 630 by an evaporation method, an inkjet method, or the like.

Then, the second electrode layer 689 is formed over the layer 688 including an organic compound. The second electrode layer 689 forms a pair of electrodes with the pixel electrode layer 630 which is the first electrode of the light-emitting element 690. The electrodes make the layer 688 including an organic compound which is arranged therebetween emit light.

A semiconductor device in FIGS. 12A and 12B has the pixel electrode layer 630 which is formed of a light-transmitting conductive material so that light emitted from the light-emitting element 690 can be transmitted therethrough and the second electrode layer 689 which is formed of a reflective conductive material so that light emitted from the light-emitting element 690 is reflected. As the second electrode layer 689, which should have reflectivity, a conductive film of, for example, titanium, tungsten, nickel, gold, platinum, silver, copper, tantalum, molybdenum, aluminum, magnesium, calcium, lithium, or alloy of any of those materials may be used. A substance which has high reflectivity with respect to light in a visible light region is preferably used. In this embodiment mode, an aluminum film is used.

The resulting light-emitting element 690 is sealed with the sealing substrate 695. The supporting substrate 600 and the sealing substrate 695 are bonded to each other with the sealant 692.

Etching used in this embodiment mode may be performed by either plasma etching (dry etching) or wet etching. Plasma etching is suitable for a large-sized substrate. As an etching gas, a fluorine-based gas such as carbon tetrafluoride, nitrogen trifluoride, or the like; or a chlorine-based gas such as chlorine, boron trichloride, or the like is used, and an inert gas such as helium or argon may be added thereto as appropriate. In the case of utilizing an etching process with atmospheric pressure discharge, local electric discharge can be performed and a layer to serve as a mask does not need to be formed over the entire surface of the substrate.

Further, a conductive layer to form a layer to serve as a wiring or a layer to serve as an electrode, a layer to serve as a mask used for forming a predetermined pattern, and the like may be formed by a method by which a pattern can be formed as selected, such as a droplet discharge method. A droplet discharge (eject) method (also referred to as an inkjet method depending on its system) can form a predetermined pattern (of a conductive layer, an insulating layer, or the like) by selectively discharging (ejecting) droplets of a composition mixed for a specific purpose. In such a method, treatment for controlling wettability or adhesion may be performed on a region on which the pattern is formed. Further, a method by which a pattern can be formed without an etching process, for example, a printing method (a method by which a pattern is formed, such as screen printing or offset printing), can be used.

As for a mask which is used in a photolithography technique, a resin material such as an epoxy resin, an acrylic resin, a phenol resin, a novolac resin, a melamine resin, or a urethane resin is used. The mask may be formed using an organic material such as benzocyclobutene, parylene, fluorinated arylene ether, or polyimide having a light-transmitting property; a compound material formed by polymerization of a siloxane-based polymer or the like; a composition material containing water-soluble homopolymer and water-soluble copolymer; or the like. Alternatively, a positive resist, a negative resist, or the like may be used. In the case of a droplet discharge method, the surface tension and viscosity of any material, which is used, are adjusted as appropriate by, for example, adjusting the concentration of a solvent, adding a surfactant, or the like.

While the semiconductor device in FIGS. 12A and 12B has a structure in which light is emitted in a direction indicated by the arrow (bottom emission), it is not particularly limited and the semiconductor device may have a structure in which light is emitted in the direction opposite to the direction indicated by the arrow (top emission) or a structure in which light is emitted from both the top and bottom surfaces.

Figure 13:
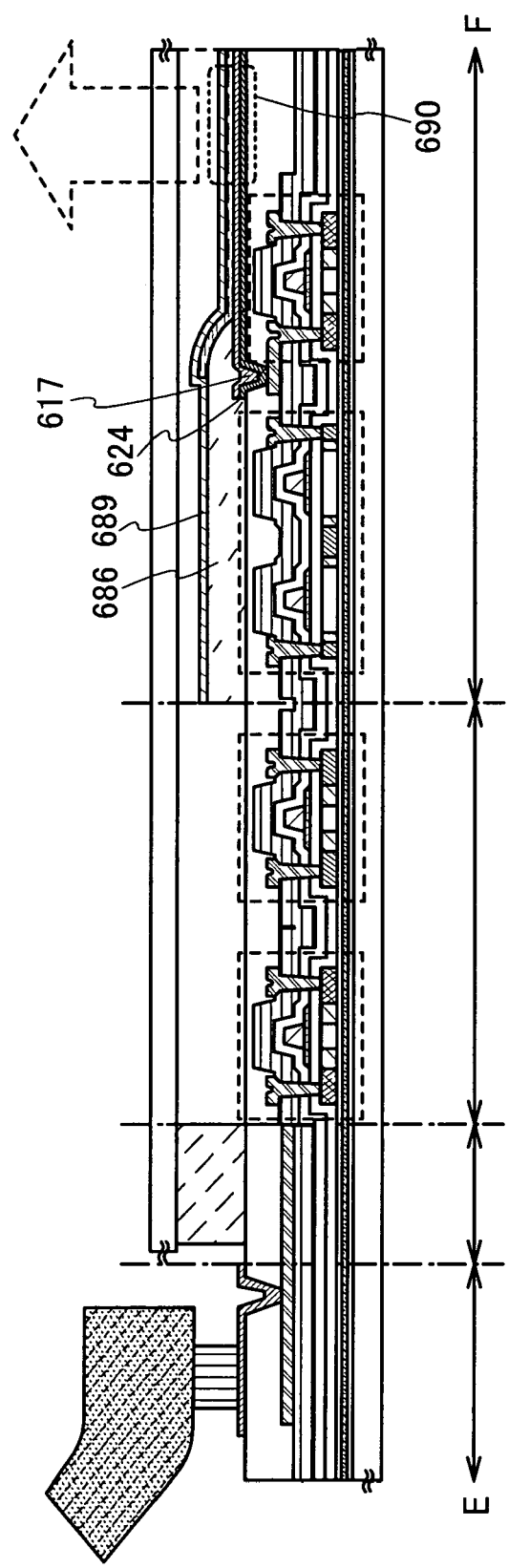
FIG. 13 is a cross-sectional view showing a structure of an active matrix EL display device in Embodiment Mode 3 of the present invention.

In FIG. 13, another structure of a semiconductor device in this embodiment mode is shown. The semiconductor device in FIG. 13 has a structure in which light is emitted in the direction indicated by the arrow (top emission). Note that, although structures of electrodes of light-emitting elements and the size of the insulating layer 686 are different between FIGS. 13 and 12B, the structure of other parts are the same and description of the same parts are omitted here.

A wiring layer 624 that is a reflective metal layer is formed below a first electrode layer 617 which is a transparent conductive film of the light-emitting element 690. As the wiring layer 624, which should have reflectivity, a conductive film of, for example, titanium, tungsten, nickel, gold, platinum, silver, copper, tantalum, molybdenum, aluminum, magnesium, calcium, lithium, or alloy of any of those materials may be used. A substance which has high reflectivity with respect to light in a visible light region is preferably used. A conductive film may also be used as the first electrode layer 617. In that case, if the first electrode layer 617 and the wiring layer 624 are not required to be stacked, a single layer of the first electrode layer 617 may be employed and the wiring layer 624 having reflectivity is not required to be provided.

The first electrode layer 617 and the second electrode layer 689 may each be formed using a transparent conductive film formed of a light-transmitting conductive material, and specifically, indium oxide containing tungsten oxide, indium zinc oxide containing tungsten oxide, indium oxide containing titanium oxide, indium tin oxide containing titanium oxide, or the like can be used. Needless to say, indium tin oxide, indium zinc oxide, indium tin oxide to which silicon oxide is added, or the like can be used.

Even when the second electrode layer 689 is formed of a material having no light-transmitting property such as a metal film, light can be emitted through the second electrode layer 689 if a thickness of the second electrode layer 689 is formed small (preferably a thickness of about 5 nm to about 30 nm) so as to be able to transmit light. As a metal thin film which can be used for the second electrode layer 689, specifically, a conductive film formed of titanium, tungsten, nickel, gold, platinum, silver, aluminum, magnesium, calcium, lithium, an alloy of any of those materials, or the like can be given.

When a structure (top emission) in which light is emitted in the direction indicated by the arrow shown in FIG. 13 is employed, an aperture ratio can be easily high, that is, an area of a light-emitting region can be easily large; therefore, even when a panel includes a unit cell having four TFTs and a unit cell having two TFTs, the area of light-emitting regions of unit cells can be the same. Accordingly, a panel which has a light-emitting region larger than that in the pixel structure shown in FIGS. 12A and 12B can be manufactured.

This embodiment mode can be freely combined with Embodiment Mode 1 or 2.

Embodiment Mode 4

This embodiment mode will describe structures of light-emitting elements that can be used for display elements in the semiconductor device of the present invention with reference to FIGS. 14A to 14D.

FIGS. 14A to 14D show structures of a light-emitting element in which an EL layer 860 is sandwiched between a first electrode layer 870 and a second electrode layer 850. The EL layer 860 includes a first layer 804, a second layer 803, and a third layer 802 as shown in the drawings. In FIGS. 14A to 14D, the second layer 803 is a light-emitting layer, and the first layer 804 and the third layer 802 are functional layers.

The first layer 804 is a layer having a function of transporting and injecting holes to the second layer 803. Here, a hole-injecting layer included in the first layer 804 includes a substance having a high hole-injecting property. As the substance having a high hole-injecting property, molybdenum oxide, vanadium oxide, ruthenium oxide, tungsten oxide, manganese oxide, or the like can be used. Further, the first layer 804 can also be formed using the following: a phthalocyanine-based compound such as phthalocyanine (abbrev.: $H_2Pc$), copper phthalocyanine (abbrev.: CuPc), or the like; an aromatic amine compound such as 4,4'-bis[N-(4-diphenylaminophenyl)-N-phenylamino]biphenyl (abbrev.: DPAB), 4,4'-bis(N-{4-[N-(3-methylphenyl)-N-phenylamino]phenyl}-N-phenylamino)biphenyl (abbrev.: DNTPD), or the like; a high molecular compound such as poly(ethylene dioxythiophene)/poly(styrenesulfonic acid) (abbrev.: PEDOT/PSS); and the like.

Further, a composite material including an organic compound and an inorganic compound can be used for the hole-injecting layer. In particular, a composite material including an organic compound and an inorganic compound showing an electron-accepting property with respect to the organic compound is excellent in a hole-injecting property and a hole-transporting property since electrons are transferred between the organic compound and the inorganic compound and carrier density is increased.

Further, in the case where a composite material including an organic compound and an inorganic compound is used for the hole-injecting layer, the hole-injecting layer can form an ohmic contact with the electrode layer; therefore, a material of the electrode layer can be selected regardless of the work function.

As the inorganic compound used for the composite material, oxide of a transition metal is preferably used. In addition, oxide of a metal belonging to Groups 4 to 8 of the periodic table can be used. Specifically, the following are preferable because an electron-accepting property is high: vanadium oxide, niobium oxide, tantalum oxide, chromium oxide, molybdenum oxide, tungsten oxide, manganese oxide, and rhenium oxide. Among them, molybdenum oxide is particularly preferable because it is stable in the atmosphere, low in hygroscopicity, and is easy to be handled.

As the organic compound used for the composite material, various compounds can be used, such as an aromatic amine compound, a carbazole derivative, aromatic hydrocarbon, or a high molecular compound (e.g., an oligomer, a dendrimer, a polymer, or the like). Note that, as the organic compound used for the composite material, it is preferable to use an organic compound having a high hole-transporting property. Specifically, it is preferable to use a substance having a hole mobility of greater than or equal to $10^{-6}$ cm$^2$/Vs. Further, other materials may also be used as long as a hole-transporting property thereof is higher than an electron-transporting property. Examples of the organic compound which can be used for the composite material are specifically listed below.

For example, as the aromatic amine compound, the following can be given: N,N'-di(p-tolyl)-N,N'-diphenyl-p-phenylenediamine (abbrev.: DTDPPA); 4,4'-bis[N-(4-diphenylaminophenyl)-N-phenylamino]biphenyl (abbrev.: DPAB); 4,4'-bis(N-{4-[N-(3-methylphenyl)-N-phenylamino]phenyl}-N-phenylamino)biphenyl (abbrev.: DNTPD); 1,3,5-tris[N-(4-diphenylaminophenyl)-N-phenylamino]benzene (abbrev.: DPA3B); and the like.

As specific examples of the carbazole derivative which can be used for the composite material, the following can be given: 3-[N-(9-phenylcarbazol-3-yl)-N-phenylamino]-9-phenylcarbazole (abbrev.: PCzPCA1); 3,6-bis[N-(9-phenylcarbazol-3-yl)-N-phenylamino]-9-phenylcarbazole (abbrev.: PCzPCA2); 3-[N-(1-naphthyl)-N-(9-phenylcarbazol-3-yl)amino]-9-phenylcarbazole (abbrev.: PCzPCN1); and the like.

Further, the following can also be used for the composite material: 4,4'-di(N-carbazolyl)biphenyl (abbrev.: CBP); 1,3,5-tris[4-(N-carbazolyl)phenyl]benzene (abbrev.: TCPB); 9-[4-(N-carbazolyl)]phenyl-10-phenylanthracene (abbrev.: CzPA); 1,4-bis[4-(N-carbazolyl)phenyl]-2,3,5,6-tetraphenylbenzene; and the like.

Further, as the aromatic hydrocarbon which can be used for the composite material, the following can be given: 2-tert-butyl-9,10-di(2-naphthyl)anthracene (abbrev.: t-BuDNA); 2-tert-butyl-9,10-di(1-naphthyl)anthracene; 9,10-bis(3,5-diphenylphenyl)anthracene (abbrev.: DPPA); 2-tert-butyl-9,10-bis(4-phenylphenyl)anthracene (abbrev.: t-BuDBA); 9,10-di(2-naphthyl)anthracene (abbrev.: DNA); 9,10-diphenylanthracene (abbrev.: DPAnth); 2-tert-butylanthracene (abbrev.: t-BuAnth); 9,10-bis(4-methyl-1-naphthyl)anthracene (abbrev.: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides the above, pentacene, coronene, or the like can also be used for the composite material. As described above, an aromatic hydrocarbon which has a hole mobility of greater than or equal to $1\times10^{-6}$ cm$^2$/Vs and of which the carbon number is 14 to 42 is more preferable for the composite material.

Note that the aromatic hydrocarbon which can be used for the composite material may have a vinyl skeleton. As examples of the aromatic hydrocarbon having a vinyl group, 4,4'-bis(2,2-diphenylvinyl)biphenyl (abbrev.: DPVBi), 9,10-bis[4-(2,2-diphenylvinyl)phenyl]anthracene (abbrev.: DPVPA), and the like can be given.

Further, a high molecular compound such as poly(N-vinylcarbazole) (abbrev.: PVK) or poly(4-vinyltriphenylamine) (abbrev.: PVTPA) can also be used for the composite material.

As a substance for forming a hole-transporting layer included in the first layer 804, a substance having a high hole-transporting property, specifically, an aromatic amine compound (that is, a compound having a benzene ring-nitrogen bond) is preferable. As examples of the material which are widely used, the following can be given: 4,4'-bis[N-(3-methylphenyl)-N-phenylamino]biphenyl; a derivative thereof such as 4,4'-bis[N-(1-napthyl)-N-phenylamino]biphenyl (hereinafter referred to as NPB); and a starburst aromatic amine compound such as 4,4',4''-tris(N,N-diphenylamino)triphenylamine, 4,4',4''-tris[N-(3-methylphenyl)-N-phenylamino]triphenylamine, and the like. These substances described here are mainly substances each having a hole mobility of greater than or equal to $10^{-6}$ cm$^2$/Vs. Further, other materials may also be used as long as a hole-transporting property thereof is higher than an electron-transporting property. The hole-transporting layer is not limited to a single layer and may be a mixed layer of any of the aforementioned substances or a stacked layer which includes two or more layers each containing the aforementioned substance.

The third layer 802 has a function of transporting and injecting electrons to the second layer 803. Here, an electron-transporting layer included in the third layer 802 is described. As the electron-transporting layer, a substance having a high electron-transporting property can be used. For example, a layer containing a metal complex or the like including a quinoline or benzoquinoline skeleton, such as tris(8-quinolinolato)aluminum (abbrev.: Alq), tris(4-methyl-8-quinolinolato)aluminum (abbrev.: Almq$_3$), bis(10-hydroxybenzo[h]quinolinato)beryllium (abbrev.: BeBq$_2$), bis(2-methyl-8-quinolinolato)(4-phenylphenolato)aluminum (abbrev.: BAlq), or the like can be used for the electron-transporting layer. Further, a layer formed of a metal complex or the like including an oxazole-based or thiazole-based ligand, such as bis[2-(2-hydroxyphenyl)benzoxazolato]zinc (abbrev.: Zn(BOX)$_2$), bis[2-(2-hydroxyphenyl)benzothiazolato]zinc (abbrev.: Zn(BTZ)$_2$), or the like can be used for the electron-transporting layer. Besides the above metal complexes, the following can be used for the electron-transporting layer: a layer formed of 2-(4-biphenylyl)-5-(4-tert-butylphenyl)-1,3,4-oxadiazole (abbrev.: PBD); 1,3-bis[5-(p-tert-butylphenyl)-1,3,4-oxadiazol-2-yl]benzene (abbrev.: OXD-7); 3-(4-biphenylyl)-4-phenyl-5-(4-tert-butylphenyl)-1,2,4-triazole (abbrev.: TAZ), bathophenanthroline (abbrev.: BPhen); bathocuproine (abbrev.: BCP); and the like. These substances described here are mainly substances each having an electron mobility of greater than or equal to $10^{-6}$ cm$^2$/Vs. Further, other substances may also be used for the electron-transporting layer as long as an electron transporting property thereof is higher than a hole transporting property. The electron-transporting layer is not limited to a single layer and may be a stacked layer which includes two or more layers each containing the aforementioned substance.

Next, an electron-injecting layer included in the third layer 802 is described. As the electron-injecting layer, a substance having a high electron-injecting property can be used. As the electron-injecting layer, an alkali metal, an alkaline earth metal, or a compound thereof such as lithium fluoride (LiF), cesium fluoride (CsF), calcium fluoride (CaF$_2$), or the like can be used. For example, a layer which is made of a substance having an electron-transporting property and contains an alkali metal, an alkaline earth metal, or a compound thereof, for example, a layer of Alq containing magnesium (Mg) or the like can be used. It is preferable to use the layer which is made of a substance having an electron-transporting property and contains an alkali metal or an alkaline earth metal as the electron-injecting layer because electron injection from the electrode layer is efficiently performed by using the layer.

Next, the second layer 803 which is a light-emitting layer is described. The light-emitting layer has a function of emitting light and includes an organic compound having a light-emitting property. Further, the light-emitting layer may include an inorganic compound. The light-emitting layer may be formed using various light-emitting organic compounds and inorganic compounds. The thickness of the light-emitting layer is preferably about 10 nm to about 100 nm.

There are no particular limitations on the organic compound used for the light-emitting layer as long as it is a light-emitting organic compound. As the organic compound, for example, the following can be given: 9,10-di(2-naphthyl) anthracene (abbrev.: DNA), 9,10-di(2-naphthyl)-2-tert-butylanthracene (abbrev.: t-BuDNA), 4,4"-bis(2,2-diphenylvinyl) biphenyl (abbrev.: DPVBi), coumarin 30, coumarin 6, coumarin 545, coumarin 545T, perylene, rubrene, periflanthene, 2,5,8,11-tetra(tert-butyl)perylene (abbrev.: TBP), 9,10-diphenylanthracene (abbrev.: DPA), 5,12-diphenyltetracene, 4-(dicyanomethylene)-2-methyl-[p-(dimethylamino) styryl]-4H-pyran (abbrev.: DCM1), 4-(dicyanomethylene)-2-methyl-6-[2-oulolidin-9-yl)ethenyl]-4H-pyran (abbrev.: DCM2), 4-(dicyanomethylene)-2,6-bis[p-(dimethylamino) styryl]-4H-pyran (abbrev.: BisDCM), and the like. Further, a compound capable of emitting phosphorescence such as bis [2-(4',6'-difluorophenyl)pyridinato-N, C$^{2'}$]iridium(picolinate) (abbrev.: FIrpic), bis{2-[3',5'-bis(trifluoromethyl)phenyl]pyridinato-N, C$^{2'}$}iridium(picolinate) (abbrev.: Ir(CF$_3$ppy)$_2$(pic)), tris(2-phenylpyridinato-N, C$^{2'}$)iridium (abbrev.: Ir(ppy)$_3$), bis(2-phenylpyridinato-N, C$^{2'}$)iridium (acetylacetonate) (abbrev.: Ir(ppy)$_2$(acac)), bis[2-(2'-thienyl) pyridinato-N, C$^{3'}$]iridium(acetylacetonate) (abbrev.: Ir(thp)$_2$ (acac)), bis(2-phenylquinolinato-N, C$^{2'}$)iridium (acetylacetonate) (abbrev.: Ir(pq)$_2$(acac)), or bis[2-(2'-benzothienyl)pyridinato-N, C$^{3'}$]iridium(acetylacetonate) (abbrev.: Ir(btp)$_2$(acac)) may be used for the organic compound used for the light-emitting layer.

Further, a triplet excitation light-emitting material containing a metal complex or the like may be used for the light-emitting layer in addition to a singlet excitation light-emitting material. For example, among pixels emitting light of red, green, and blue, the pixel emitting light of red whose luminance is reduced by half in a relatively short time is formed using a triplet excitation light-emitting material and the other pixels are formed using a singlet excitation light-emitting material. A triplet excitation light-emitting material has a feature of favorable light-emitting efficiency, so that less power is consumed to obtain the same luminance. In other words, when a triplet excitation light-emitting material is used for the pixel emitting light of red, a smaller amount of current is necessary to be applied to a light-emitting element; thus, reliability can be improved. The pixel emitting light of red and the pixel emitting light of green may be formed using a triplet excitation light-emitting material and the pixel emitting light of blue may be formed using a singlet excitation light-emitting material in order to achieve low power consumption. Low power consumption can be further achieved by formation of a light-emitting element that emits light of green, which has high visibility for human eyes, with the use of a triplet excitation light-emitting material.

Another organic compound may be further added to the light-emitting layer including any of the above-described organic compounds which emit light. Examples of the organic compound that can be added are TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, DPVBi, and the like, and 4,4'-bis(N-carbazolyl)biphenyl (abbrev.: CBP), 1,3,5-tris[4-(N-carbazolyl)phenyl]benzene (abbrev.: TCPB), and the like. However, the present invention is not limited thereto. It is preferable that the organic compound which is added in addition to the organic compound which emits light have a larger excitation energy and be added in a larger amount than the organic compound which emits light, in order to make the organic compound emit light efficiently (which makes it possible to prevent concentration quenching of the organic compound which emits light). Further, as another function, the added organic compound may emit light along with the organic compound which emits light (which makes it possible to emit white light or the like).

The light-emitting layer may have a structure in which color display is performed by formation of a light-emitting layer having a different emission wavelength range for each pixel. Typically, light-emitting layers corresponding to respective colors of R (red), G (green), and B (blue) are formed. Also in this case, color purity can be improved and a pixel region can be prevented from having a mirror surface (reflection) by provision of a filter which transmits light of the emission wavelength range on the light-emission side of the pixel. By provision of the filter, a circularly polarizing plate or the like that has been conventionally considered to be necessary can be omitted, and further, the loss of light emitted from the light-emitting layer can be eliminated. Further, change in color tone, which occurs when a pixel region (display screen) is obliquely seen, can be reduced.

Either a low-molecular organic light-emitting material or a high-molecular organic light-emitting material may be used for a material of the light-emitting layer. A high-molecular organic light-emitting material has higher physical strength than a low-molecular organic light-emitting material and an element using the high-molecular organic light-emitting material has higher durability than an element using a low-molecular material. In addition, since a high-molecular organic light-emitting material can be formed by coating, the element can be relatively easily formed.

The color of light emission is determined depending on a material forming the light-emitting layer; therefore, a light-emitting element which emits light of a desired color can be formed by selecting an appropriate material for the light-emitting layer. As a high-molecular electroluminescent material which can be used for forming the light-emitting layer, a polyparaphenylene-vinylene-based material, a polyparaphenylene-based material, a polythiophene-based material, a polyfluorene-based material, and the like can be given.

As the polyparaphenylene-vinylene-based material, a derivative of poly(paraphenylenevinylene) [PPV] such as poly(2,5-dialkoxy-1,4-phenylenevinylene) [RO-PPV], poly (2-(2'-ethyl-hexoxy)-5-methoxy-1,4-phenylenevinylene) [MEH-PPV], poly(2-(dialkoxyphenyl)-1,4-phenylenevinylene) [ROPh-PPV], and the like can be given. As the polyparaphenylene-based material, a derivative of polyparaphenylene [PPP] such as poly(2,5-dialkoxy-1,4-phenylene) [RO- PPP], poly(2,5-dihexoxy-1,4-phenylene), and the like can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly(3-cyclohexyl-4-methylthiophene) [PCHMT], poly(3,4-dicyclohexylthiophene) [PDCHT], poly[3-(4-octylphenyl)-thiophene] [POPT], poly[3-(4-octylphenyl)-2, 2bithiophene] [PTOPT], and the like can be given. As the polyfluorene-based material, a derivative of polyfluorene [PF] such as poly(9,9-dialkylfluorene) [PDAF], poly(9,9-dioctylfluorene) [PDOF], and the like can be given.

The inorganic compound used for the light-emitting layer may be any inorganic compound as long as light emission of the organic compound is not easily quenched by the inorganic compound, and various kinds of metal oxide and metal nitride may be used. In particular, oxide of a metal that belongs to Group 13 or 14 of the periodic table is preferable because light emission of the organic compound is not easily quenched, and specifically, aluminum oxide, gallium oxide, silicon oxide, and germanium oxide are preferable. However, the inorganic compound is not limited thereto.

Note that the light-emitting layer may be formed by stacking a plurality of layers each containing a combination of the organic compound and the inorganic compound, which are described above, or may further contain another organic compound or inorganic compound. A layer structure of the light-emitting layer can be changed, and an electrode layer for injecting electrons may be provided or light-emitting materials may be dispersed, instead of provision of a specific electron-injecting region or light-emitting region. Such a change can be permitted unless it departs from the spirit of the present invention.

A light-emitting element formed using the above materials emits light by being forwardly biased. A pixel of a semiconductor device which is formed using a light-emitting element can be driven by a passive matrix mode or an active matrix mode. In either case, each pixel emits light by application of forward bias thereto at a specific timing; however, the pixel is in a non-light-emitting state for a certain period. Reliability of a light-emitting element can be improved by application of reverse bias in the non-light-emitting time. In a light-emitting element, there is a deterioration mode in which light emission intensity is decreased under a constant driving condition or a deterioration mode in which a non-light-emitting region is increased in the pixel and luminance is apparently decreased. However, progression of deterioration can be slowed down by performing alternating driving in which bias is applied forwardly and reversely; thus, reliability of a semiconductor device including a light-emitting element can be improved. In addition, either digital driving or analog driving can be applied to drive the pixel.

A color filter (colored layer) may be provided for a sealing substrate. The color filter can be formed by an evaporation method or a droplet discharge method. High-definition display can be performed with the use of the color filter. This is because a broad peak can be modified to be sharp in a light emission spectrum of each of RGB by the color filter.

Full color display can be performed by formation of a material emitting light of a single color and combination of the material with a color filter or a color conversion layer. The color filter or the color conversion layer may be provided for, for example, the sealing substrate, and the sealing substrate may be attached to the element substrate.

Needless to say, display of single color light emission may also be performed. For example, an area color type semiconductor device may be formed by using single color light emission.

Figure 14A:
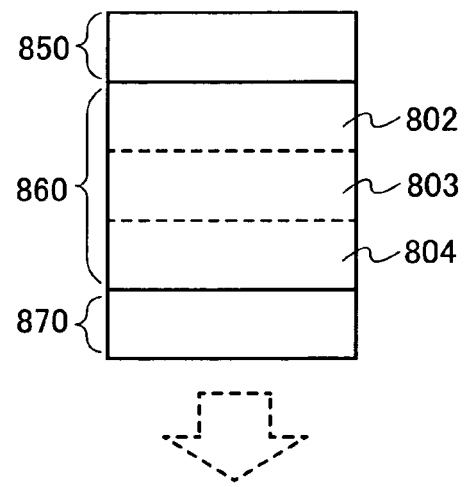
FIGS. 14A to 14D are diagrams showing a stacked layer of a light-emitting element in Embodiment Mode 4 of the present invention.
Figure 14B:
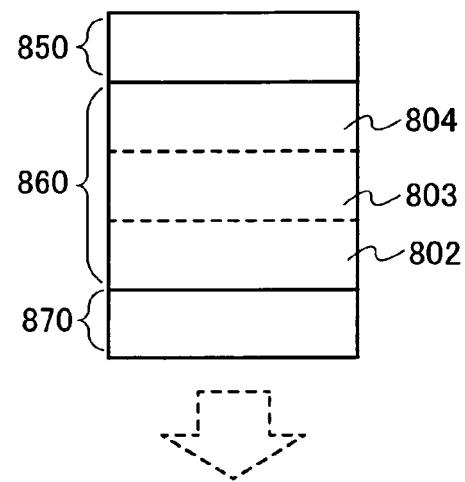

It is necessary to select materials for the first electrode layer 870 and the second electrode layer 850 considering the work function in FIGS. 14A to 14D. The first electrode layer 870 and the second electrode layer 850 can be either an anode (an electrode layer with high potential) or a cathode (an electrode layer with low potential) depending on the pixel structure. In the case where the polarity of a driving thin film transistor is a p-channel type, the first electrode layer 870 may serve as an anode and the second electrode layer 850 may serve as a cathode as shown in FIG. 14A. In the case where the polarity of the driving thin film transistor is an n-channel type, the first electrode layer 870 may serve as a cathode and the second electrode layer 850 may serve as an anode as shown in FIG. 14B. Here, materials that can be used for the first electrode layer 870 and the second electrode layer 850 are described below. It is preferable to use a material having a high work function (specifically, a material having a work function of greater than or equal to 4.5 eV) for one of the first electrode layer 870 and the second electrode layer 850, which serves as an anode, and a material having a low work function (specifically, a material having a work function of less than or equal to 3.5 eV) for the other electrode layer which serves as a cathode. However, since the first layer 804 is excellent in a hole-injecting property and a hole-transporting property and the third layer 802 is excellent in an electron-injecting property and an electron-transporting property, both the first electrode layer 870 and the second electrode layer 850 are scarcely restricted by a work function and various materials can be used.

The light-emitting elements in FIGS. 14A and 14B each have a structure in which light is extracted from the first electrode layer 870 and thus, the second electrode layer 850 need not necessarily have a light-transmitting property. The second electrode layer 850 may be formed of a film mainly containing an element selected from titanium, nickel, tungsten, chromium, platinum, zinc, tin, indium, tantalum, aluminum, copper, gold, silver, magnesium, calcium, lithium or molybdenum, or an alloy material or a compound material containing any of the above elements as its main component, such as titanium nitride, titanium silicon nitride, tungsten silicide, tungsten nitride, tungsten silicide nitride, or niobium nitride; or a stacked film thereof with a total thickness of 100 nm to 800 nm.

In addition, when the second electrode layer 850 is formed using a light-transmitting conductive material similarly to the material used for the first electrode layer 870, light can be extracted from the second electrode layer 850 as well, and a dual emission structure can be obtained, in which light from the light-emitting element is emitted through both the first electrode layer 870 and the second electrode layer 850.

Note that the light-emitting element of the present invention can have variations by changing material types of the first electrode layer 870 and the second electrode layer 850.

FIG. 14B shows the case where the EL layer 860 is formed by stacking the third layer 802, the second layer 803, and the first layer 804 in this order from the first electrode layer 870 side.

Figure 14C:
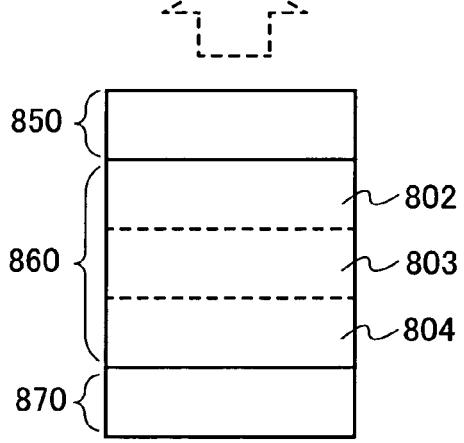
Figure 14D:
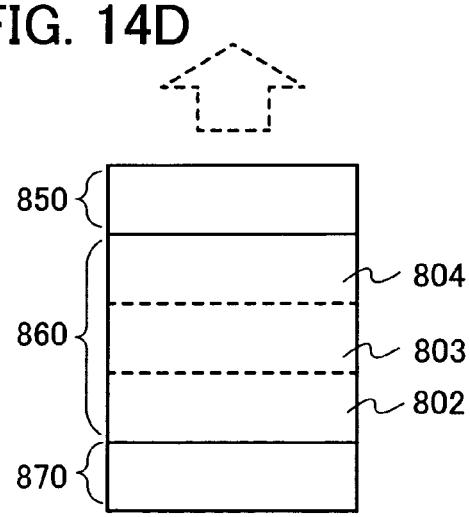

FIG. 14C shows the case where an electrode layer having reflectivity is used for the first electrode layer 870 and an electrode layer having a light-transmitting property is used for the second electrode layer 850 in FIG. 14A. In FIG. 14C, light emitted from the light-emitting layer is reflected at the first electrode layer 870, transmitted through the second electrode layer 850, and emitted to the outside. Similarly, FIG. 14D shows the case where an electrode layer having reflectivity is used for the first electrode layer 870 and an electrode layer having a light-transmitting property is used for the second electrode layer 850 in FIG. 14B. In FIG. 14D, light emitted from the light-emitting layer is reflected at the first electrode layer 870, transmitted through the second electrode layer 850, and emitted to the outside.

Further, various methods can be used as a method for forming the EL layer 860 when an organic compound and an inorganic compound are mixed in the EL layer 860. For example, there is a co-evaporation method for vaporizing both an organic compound and an inorganic compound by resistance heating. Further, for co-evaporation, an inorganic compound may be vaporized by an electron beam (EB) while an organic compound is vaporized by resistance heating. Furthermore, a method for sputtering an inorganic compound while vaporizing an organic compound by resistance heating to deposit the both at the same time may also be used. Instead, the EL layer 860 may be formed by a wet method.

As a method for manufacturing the first electrode layer 870 and the second electrode layer 850, an evaporation method by resistance heating, an EB evaporation method, a sputtering method, a CVD method, a spin coating method, a printing method, a dispenser method, a droplet discharge method, or the like can be used.

This embodiment mode can be freely combined with any one of Embodiment Modes 1 to 3 as appropriate. If the method for manufacturing a semiconductor substrate described in Embodiment Mode 1 or 2 is used, a semiconductor device having a light-emitting element which has high performance and high reliability can be manufactured with high throughput and good productivity even when a large-sized semiconductor device is used.

Embodiment Mode 5

Figure 15A:
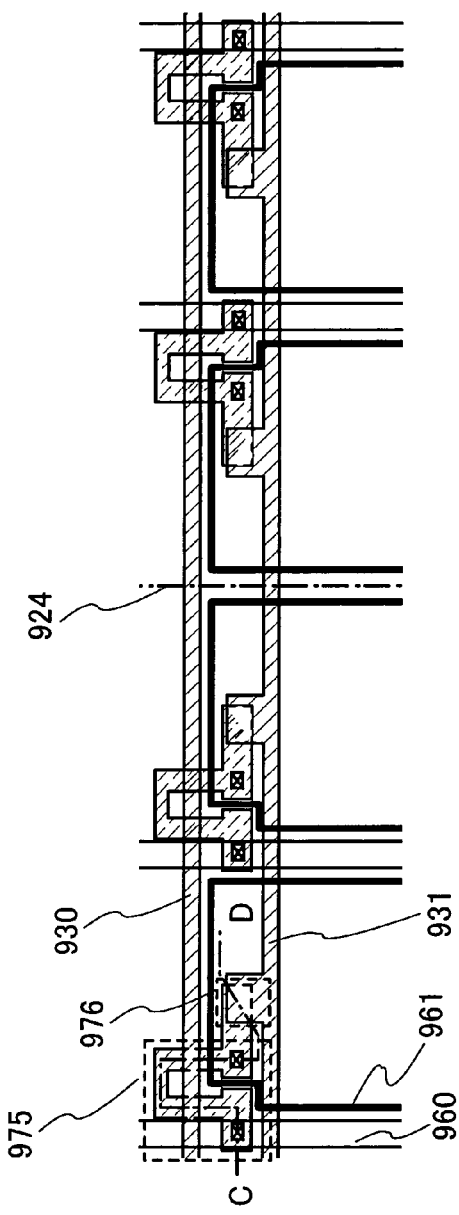
FIGS. 15A and 15B are diagrams showing a cross-sectional structure diagram of an active matrix liquid crystal display device in Embodiment Mode 5 of the present invention.
Figure 15B:
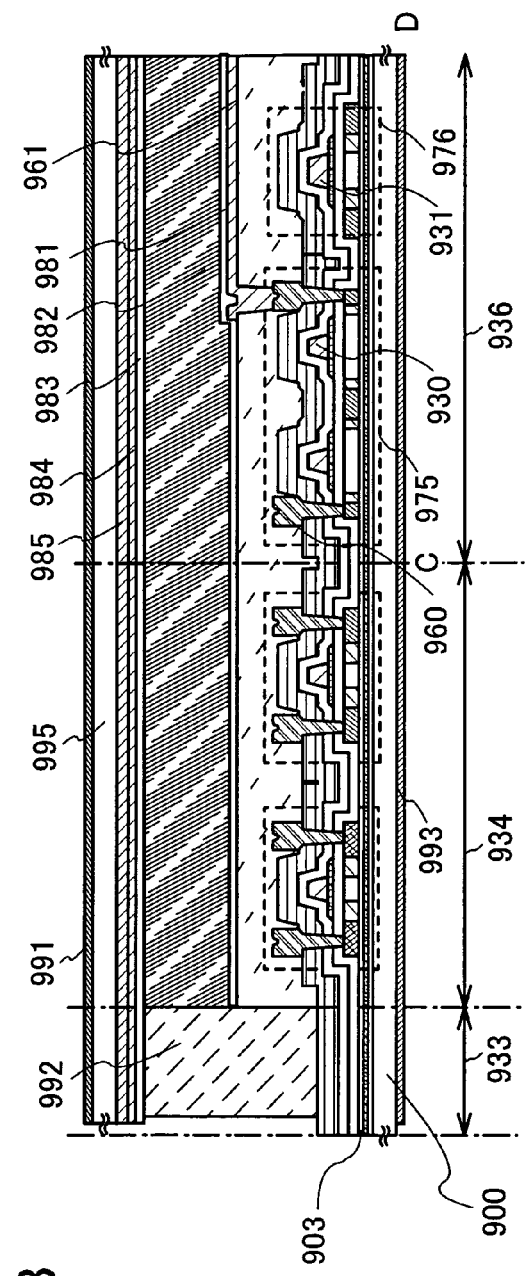

While Embodiment Mode 3 describes an example in which a semiconductor device using a light-emitting element is manufactured, this embodiment mode describes an example in which a semiconductor device using a liquid crystal element is manufactured with reference to FIGS. 15A and 15B.

First, an island-shaped single-crystal semiconductor layer is formed over a supporting substrate 900, which is a glass substrate, according to Embodiment Mode 1 or 2. Note that, since details of the method are described in Embodiment Mode 1 or 2, they are omitted here and the method is described briefly.

Since the following steps, that is, a method for manufacturing a TFT using a single-crystal semiconductor layer is approximately the same as those in Embodiment Mode 3, description of the details is omitted here. Note that TFTs used in a light-emitting device and TFTs used in a liquid crystal display device have different intended use; therefore, channel lengths and channel widths are adjusted as appropriate, and TFTs in a light-emitting device and in a liquid crystal display device have different designs. In particular, a light-emitting device includes a unit cell having two or more TFTs, while a liquid crystal display device can be manufactured using a unit cell having one TFT. In addition, while a light-emitting device includes a power supply line, a liquid crystal display device does not include a power supply line and includes a capacitor line. In a liquid crystal display device, n-channel TFTs may be used alone if a drive circuit is not formed over the same substrate.

In FIG. 15A, an example of a top view of a pixel is shown. A boundary line 924 indicated by a chain line in FIG. 15A is a juncture between different semiconductor substrates which are attached. Pixel electrode layers 961 are arranged in one direction, and the boundary line 924 is positioned therebetween. The pixel structure is symmetric with respect to the boundary line 924. Thus, a single-crystal semiconductor layer can be kept away from the boundary line 924. Although the single-crystal semiconductor layers are located in the unit cells which are next to each other with the boundary line 924 therebetween, a sufficient distance can be kept between the single-crystal semiconductor layer and the boundary line 924.

In addition, a capacitor line 931 and the single-crystal semiconductor layer are overlapped with each other with an insulating film interposed therebetween and a capacitor portion 976 is formed. A transistor 975 that is a multi-channel type n-channel thin film transistor is located near an intersection of a gate wiring 930 and a source wiring 960. Here, the gate wiring 930 and the single-crystal semiconductor layer are overlapped with each other with the insulating film interposed therebetween and an overlapped portion serves as a channel formation region of a TFT. The single-crystal semiconductor layer is electrically connected to the source wiring 960 through a contact hole. In addition, the single-crystal semiconductor layer is electrically connected to the pixel electrode layer 961 through a contact hole.

In the case of a transmissive liquid crystal display device, the pixel electrode layer 961 can be formed using indium tin oxide, indium zinc oxide (IZO) in which zinc oxide is mixed with indium oxide, a conductive material in which silicon oxide is mixed with indium oxide, organic indium, organotin, indium oxide containing tungsten oxide, indium zinc oxide containing tungsten oxide, indium oxide containing titanium oxide, or indium tin oxide containing titanium oxide. Alternatively, in the case of a reflective liquid crystal display device, aluminum, silver, or an alloy thereof is used for the pixel electrode layer 961.

Note that a cross-sectional view taken along dotted line C-D in FIG. 15A corresponds to a pixel region 936 in FIG. 15B. Note that FIG. 15A is a top view of a liquid crystal display device in which steps up to formation of a pixel electrode are performed. FIG. 15B is a cross-sectional view of a liquid crystal display device in which a sealing substrate 995 is attached with a sealant 992 and a polarizer is further provided.

A liquid crystal display device in FIG. 15B includes a sealing region 933, a drive circuit region 934, and the pixel region 936. An insulating layer 981 which is called an alignment film is formed over the pixel electrode layer 961 by a printing method or a droplet discharge method, and then, rubbing treatment is performed. Note that, depending on a mode of liquid crystal, rubbing treatment is not performed in some cases. An insulating layer 983 serving as an alignment film which is provided for the sealing substrate 995 is formed by a similar method to the method for forming the insulating layer 981. The sealing substrate 995 has a conductive layer 984 serving as a counter electrode, a color layer 985 serving as a color filter, and a polarizer 991 (also referred to as a polarizing plate), in addition to the insulating layer 983. Further, the sealing substrate 995 may have a shielding film (a black matrix) and the like.

Since the liquid crystal display device of this embodiment mode is of a transmissive type, a polarizer 993 is provided on an opposite side of the supporting substrate 900 from elements. A retardation plate may be provided between the polarizer 993 and a liquid crystal layer 982. In addition, an anti-reflection film which prevents external light from being reflected to a viewing side may be provided on the viewing side which is a nearest side to a user.

Note that, when RGB light-emitting diodes (LEDs) or the like are located in a backlight and a field sequential method which conducts color display by time division is employed, there is the case where a color filter is not provided. The black matrix is preferably provided so as to overlap a transistor and a CMOS circuit for the sake of reducing reflection of external light by wirings of the transistor and the CMOS circuit. Note that the black matrix may also be provided so as to be overlapped with the capacitor. This is because reflection of light by a metal film forming the capacitor can be prevented.

The liquid crystal layer 982 can be formed by a dispenser method (a dripping method), or an injecting method by which liquid crystal is injected using a capillary action after attaching the supporting substrate 900 having elements to the sealing substrate 995. A dripping method may be employed when a large substrate to which an injection method is difficult to be applied is used.

Although the spacer may be provided in such a way that particles each having a size of several micrometers are sprayed, the spacer may be formed by a method in which a resin film is formed over an entire surface of the substrate and then etched.

In this embodiment mode, an oxide film 903 can include a halogen element. The oxide film 903 can serve as a protective film which captures an impurity such as metal and prevent contamination of the single-crystal semiconductor layer. Thus, reliability can be improved.

This embodiment mode can be freely combined with any one of Embodiment Modes 1 to 4.

Embodiment Mode 6

By applying the present invention, various semiconductor devices having a display function can be formed. That is, the present invention can be applied to various electronic devices in which these semiconductor devices having a display function are incorporated into display portions. In this embodiment mode, examples of electronic devices including a semiconductor device having a display function for providing high performance and high reliability are described.

As an electronic device of the present invention, a television device (also referred to simply as a television or a television receiver), a camera such as a digital camera or a digital video camera, a mobile phone set (also referred to simply as a mobile phone or a cell-phone), a portable information terminal such as a PDA or the like, a portable game machine, a monitor for a computer, a computer, an audio reproducing device such as a car audio system or the like, an image reproducing device provided with a recording medium such as a home game machine or the like (typically, a digital versatile disc (DVD)), and the like can be given. Specific examples thereof are described with reference to FIGS. 16A to 16C.

A television device can be completed using a semiconductor device which includes a display element and is formed by the present invention. An example of a television device for providing high performance and high reliability is described with reference to FIG. 16A.

A television device can be completed by incorporating a display module into a housing. A display panel in which components up to an FPC are set as shown in FIGS. 12A and 12B is generally called an EL display module. When an EL display module as shown in FIGS. 12A and 12B is used, an EL television device can be completed. In addition, a display panel shown in FIG. 13 is generally called a liquid crystal display module. Therefore, when a liquid crystal display module as shown in FIGS. 15A and 15B is used, a liquid crystal television device can be completed. A main screen 2003 is formed by using the display module, and a speaker unit 2009, operation switches, and the like are provided as other attached equipments. Thus, a television device can be completed in accordance with the present invention.

Figure 16A:
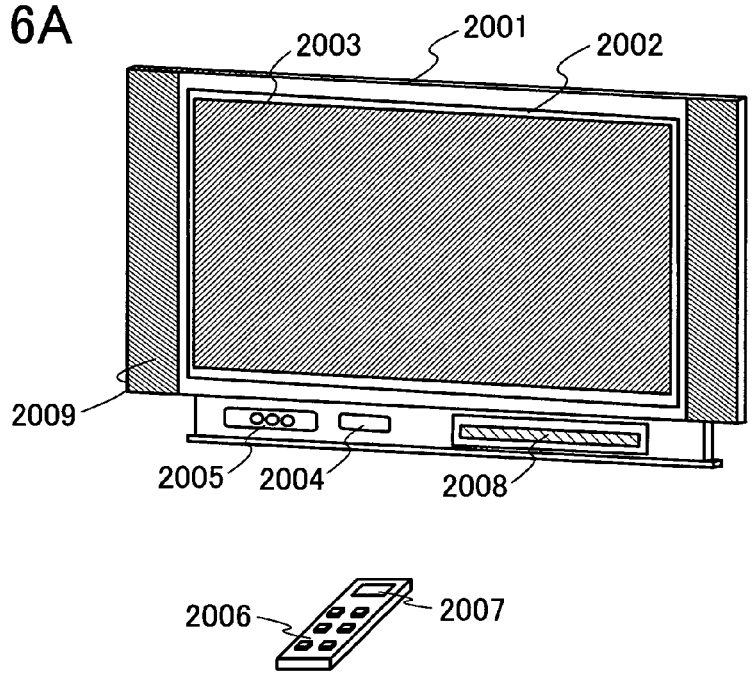
FIGS. 16A to 16C are diagrams showing examples of electronic devices in Embodiment Mode 6 of the present invention.

As shown in FIG. 16A, a display panel 2002 which uses display elements is incorporated into a chassis 2001. With the use of a receiver 2005, in addition to reception of general TV broadcast, information communication can also be carried out in one way (from a transmitter to a receiver) or in two ways (between a transmitter and a receiver or between receivers) by connection to a communication network by a fixed line or wirelessly through a modem 2004. The television set can be operated by switches incorporated in the chassis or by a remote controller 2006 separated from the main body. A display portion 2007 that displays information to be output may also be provided in this remote controller.

In addition, for the television device, a structure for displaying a channel, sound volume, or the like may be additionally provided by formation of a sub-screen 2008 which is formed using a second display panel in addition to the main screen 2003 which is formed using a first display panel. In this structure, the first display panel may be formed using an EL display panel superior in viewing angle, and the second display panel may be formed using a liquid crystal display panel capable of displaying with low power consumption. In order to prioritize low power consumption, a structure in which the first display panel is formed using a liquid crystal display panel, the second display panel is formed using an EL display panel, and the second display panel is able to flash on and off may be employed. By the present invention, a semiconductor device with high performance and high reliability can be manufactured with high productivity even with the use of a large-sized substrate with a number of TFTs and electronic components.

In accordance with the present invention, a semiconductor device with high performance and high reliability which has a display function can be manufactured with high productivity. Therefore, a television device with high performance and high reliability can be manufactured with high productivity.

Figure 16B:
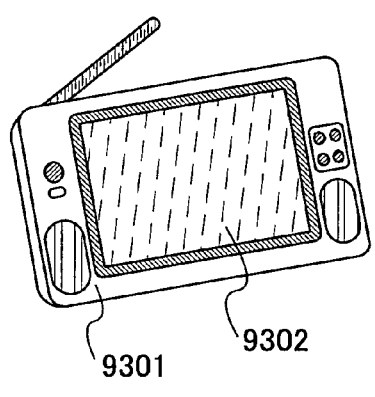

A portable television device shown in FIG. 16B includes a main body 9301, a display portion 9302, and the like. The semiconductor device of the present invention is applicable to the display portion 9302. Accordingly, a portable television device with high performance and high reliability can be provided. The semiconductor device of the present invention is applicable to various types of television devices including a medium-sized television that is portable, and a large-sized television (e.g., 40 inches or more in size).

Figure 16C:
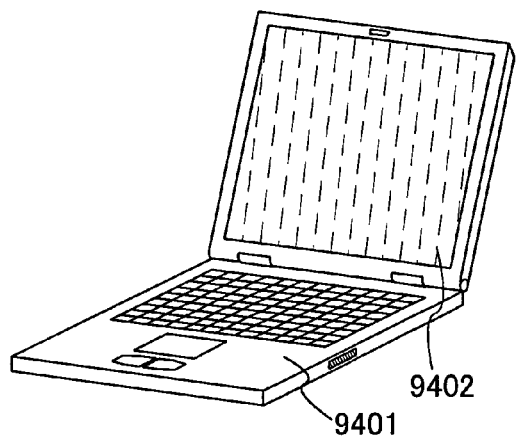

A portable computer shown in FIG. 16C includes a main body 9401, a display portion 9402, and the like. The semiconductor device of the present invention is applicable to the display portion 9402. A semiconductor device having a 15-inch display portion can be manufactured if a semiconductor substrate is formed according to Embodiment Mode 1 or 2. Accordingly, a portable computer with high performance and high reliability can be provided.

This embodiment mode can be freely combined with any one of Embodiment Modes 1 to 5.

This application is based on Japanese Patent Application serial No. 2007-183906 filed with Japan Patent Office on Jul. 13, 2007, the entire contents of which are hereby incorporated by reference.

What is claimed is:

1. A method for manufacturing a semiconductor device, comprising:
  doping a plurality of single-crystal semiconductor substrates with hydrogen to form an embrittlement layer in each of the plurality of single-crystal semiconductor substrates;

bonding each of the plurality of single-crystal semiconductor substrates to a first substrate;
removing a portion of each of the plurality of single-crystal semiconductor substrates at the embrittlement layer by performing heat treatment to form a plurality of single-crystal semiconductor layers over the first substrate;
dividing the first substrate and the plurality of single-crystal semiconductor layers to form a plurality of pieces of single-crystal semiconductor, each of the plurality of pieces of single-crystal semiconductor including a piece of the first substrate;
bonding a supporting substrate to each of the plurality of pieces of single-crystal semiconductor;
separating at least a portion of the piece of the first substrate from each of the plurality of pieces of single-crystal semiconductor;
bonding each of the plurality of pieces of single-crystal semiconductor to a second substrate having an insulating surface; and
removing the supporting substrate from each of the plurality of pieces of single-crystal semiconductor.

2. A method for manufacturing a semiconductor device according to claim 1,
wherein each of the plurality of pieces of single-crystal semiconductor is in contact with each other over the second substrate.

3. A method for manufacturing a semiconductor device according to claim 1,
wherein the second substrate is a glass substrate.

4. A method for manufacturing a semiconductor device according to claim 1, comprising:
after forming the plurality of single-crystal semiconductor layers over the first substrate, processing the plurality of single-crystal semiconductor layers into a plurality of single-crystal semiconductor islands;
forming an insulating layer over the plurality of single-crystal semiconductor islands; and
dividing the first substrate, the insulating layer and the plurality of single-crystal semiconductor islands to form a plurality of pieces of single-crystal semiconductor, each of the plurality of pieces of single-crystal semiconductor including a piece of the first substrate and a piece of the insulating layer.

5. A method for manufacturing a semiconductor device, comprising:
doping a plurality of single-crystal semiconductor substrates with hydrogen to form an embrittlement layer in each of the plurality of single-crystal semiconductor substrates;
forming a separation layer over a first substrate;
bonding each of the plurality of single-crystal semiconductor substrates to the separation layer over the first substrate;
removing a portion of each of the plurality of single-crystal semiconductor substrates at the embrittlement layer by performing heat treatment to form a plurality of single-crystal semiconductor layers over the first substrate through the separation layer;
forming an insulating layer over the plurality of single-crystal semiconductor layers;
dividing the first substrate, the separation layer, the insulating layer and the plurality of single-crystal semiconductor layers to form a plurality of pieces of single-crystal semiconductor, each of the plurality of pieces of single-crystal semiconductor including a piece of the first substrate, a piece of the separation layer and a piece of the insulating layer;
bonding a supporting substrate to each of the plurality of pieces of single-crystal semiconductor;
separating at least a portion of the piece of the first substrate from each of the plurality of pieces of single-crystal semiconductor at the piece of the separation layer;
bonding each of the plurality of pieces of single-crystal semiconductor to a second substrate having an insulating surface; and
removing the supporting substrate from each of the plurality of pieces of single-crystal semiconductor.

6. A method for manufacturing a semiconductor device according to claim 5,
wherein each of the plurality of pieces of single-crystal semiconductor is in contact with each other over the second substrate.

7. A method for manufacturing a semiconductor device according to claim 5,
wherein the second substrate is a glass substrate.

8. A method for manufacturing a semiconductor device according to claim 5, comprising:
after forming the plurality of single-crystal semiconductor layers over the first substrate, processing the plurality of single-crystal semiconductor layers into a plurality of single-crystal semiconductor islands;
forming the insulating layer over the plurality of single-crystal semiconductor islands; and
dividing the first substrate, the separation layer, the insulating layer and the plurality of single-crystal semiconductor islands to form a plurality of pieces of single-crystal semiconductor, each of the plurality of pieces of single-crystal semiconductor including a piece of the first substrate, a piece of the separation layer and a piece of the insulating layer.

* * * * *